(12) United States Patent
Taniguchi

(10) Patent No.: US 8,796,126 B2
(45) Date of Patent: Aug. 5, 2014

(54) METHOD OF MANUFACTURING SEMICONDUCTOR DEVICE

(71) Applicant: Elpida Memory, Inc., Tokyo (JP)

(72) Inventor: Koji Taniguchi, Tokyo (JP)

(73) Assignee: PS4 Luxco, S.a.r.l., Luxembourg (LU)

( * ) Notice: Subject to any disclaimer, the term of this patent is extended or adjusted under 35 U.S.C. 154(b) by 38 days.

(21) Appl. No.: 13/715,143

(22) Filed: Dec. 14, 2012

(65) Prior Publication Data

US 2013/0164909 A1 Jun. 27, 2013

(30) Foreign Application Priority Data

Dec. 26, 2011 (JP) .................. 2011-283096

(51) Int. Cl.
*H01L 21/44* (2006.01)

(52) U.S. Cl.
USPC ............ 438/589; 257/E21.429; 257/E21.655; 438/270; 438/400

(58) Field of Classification Search
USPC ........... 257/E21.429, E21.655; 438/270, 400, 438/589
See application file for complete search history.

(56) References Cited

U.S. PATENT DOCUMENTS

| 2007/0096185 A1* | 5/2007 | Kim et al. ............. 257/301 |
| 2007/0138545 A1* | 6/2007 | Lin et al. ............. 257/330 |
| 2010/0279497 A1* | 11/2010 | Lee ..................... 438/589 |
| 2011/0147834 A1* | 6/2011 | Taniguchi ............ 257/330 |
| 2011/0204438 A1* | 8/2011 | Taniguchi ............ 257/331 |

FOREIGN PATENT DOCUMENTS

JP 2010-232446 10/2010

\* cited by examiner

*Primary Examiner* — Asok K Sarkar

(74) *Attorney, Agent, or Firm* — Young & Thompson

(57) ABSTRACT

A method of manufacturing a semiconductor device includes forming an insulating isolation portion in a groove of a substrate, forming a projection portion in which an upper portion of the insulating isolation portion projects from a principal surface of the substrate, forming a sidewall spacer covering a side surface of the projection portion and part of the principal surface of the substrate along the side surface of the projection portion, and forming a first trench in the substrate by etching the substrate using the sidewall spacer as a mask.

20 Claims, 35 Drawing Sheets

METHOD OF MANUFACTURING SEMICONDUCTOR DEVICE

This application is based upon and claims priority to prior application JP 2011-283096, filed on Dec. 26, 2011, the disclosure of which is incorporated herein by reference.

BACKGROUND OF THE INVENTION

1. Field of the Invention

The present invention relates to a method of manufacturing a semiconductor device.

2. Description of Related Art

Patent Literature 1 discloses a process of forming gate trenches in active regions partitioned by device isolation regions with shallow trench isolation (STI).

By providing such trench gate electrodes in active regions, a trench gate type of metal insulator semiconductor (MIS) transistors can be formed.

In this case, active regions located on both sides of each trench gate electrode serve as a pair of impurity diffusion regions (source and drain regions). Furthermore, the gate electrodes in the gate trenches are formed with a line and space pattern (L/S pattern) so that they stride a plurality of active regions.

Patent Literature 1: JP-A 2010-232446

SUMMARY

The inventors have examined the aforementioned art and found the following.

If the depth of trenches for device isolation and the depth of gate trenches for trench gate electrodes differ from each other depending upon required characteristics, then the trenches for device isolation and the gate trenches for trench gate electrodes need to be formed by separate processes.

In a typical example of this case, device isolation regions are formed with STI, and then gate trenches are formed in active regions by using photolithography technology, dry etching technology, and the like.

At that time, intervals between the gate trenches and the device isolation regions may possibly vary depending upon processing variations. Since the active regions, which are formed between the gate trenches and the device isolation regions, are in contact with contact plugs, the aforementioned variations of the intervals may cause variation in contact resistance. Thus, the general method has a room for improvement in view of variations in device characteristics.

In one embodiment, there is provided a method of manufacturing a semiconductor device, comprising forming an isolation portion in a groove of a substrate, forming a projection portion in which an upper portion of the isolation portion projects from a surface of the substrate, forming a sidewall spacer covering a side surface of the projection portion and part of the surface of the substrate along the side surface of the projection portion, and forming a first trench in the substrate by etching the substrate using the sidewall spacer as a mask.

In another embodiment, there is provided a method of manufacturing a semiconductor device. The method comprises forming isolation portions in grooves of a substrate, forming at least a pair of projection portions in which upper portions of the isolation portions project from a surface of the substrate, forming sidewall spacers covering side surfaces of the projection portions and part of the surface of the substrate along the side surfaces of the projection portions, and forming a first trench in the substrate by etching the substrate using the sidewall spacers as a mask. The forming the sidewall spacers includes forming a window to expose the surface of the substrate between the sidewall spacers of the at least the pair of projection portions facing each other.

In still another embodiment, there is provided a method of manufacturing a semiconductor device, comprising forming isolation portions in grooves of a substrate, forming at least a pair of projection portions in which upper portions of the isolation portions project from the surface of the substrate, and forming sidewall spacers, a belt-like pattern and windows in the same process step. The sidewall spacers cover each side surface of the projection portions and part of the surface of the substrate along the side surface of the projection portions. The belt-like pattern arranged between the sidewall spacers of at least the pair of projection portions face each other. The window exposes the surface of the substrate between the sidewall spacer and the belt-like pattern. The method further comprises forming a first trench in the substrate by etching using the sidewall spacers and the belt-like pattern as a mask.

With a method of manufacturing a semiconductor device according to an aspect of the present invention, an isolation portion is formed in a groove (or trench) defined in a surface of a substrate. Then a projection portion is formed in which an upper portion of the isolation portion projects from the surface of the substrate. Subsequently, a sidewall spacer is formed so as to extend from a side surface of the projection portion and cover part of the surface of the substrate that is located close to the side surface of the projection portion. Thereafter, a first trench is formed in the substrate by etching the surface of the substrate using the sidewall spacer as a mask. As a result, the first trench can be formed in a self-aligned manner with respect to the position of the side surface of the projection portion.

Thus, the positional precision is improved when the first trench is being processed. Therefore, variations of an interval between the trench in which the isolation portion is formed and the first trench can be reduced on the plane of the substrate.

BRIEF DESCRIPTION OF THE DRAWINGS

The above features and advantages of the present invention will be more apparent from the following description of certain preferred embodiments taken in conjunction with the following accompanying drawings.

DETAILED DESCRIPTION OF THE PREFERRED EMBODIMENTS

Figure 1A:
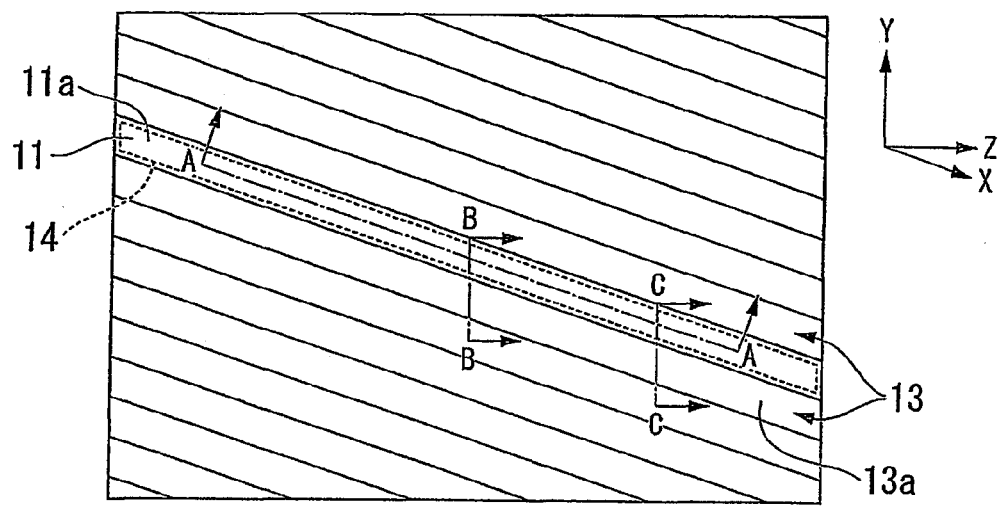
FIG. 1A is a plan view showing a step of manufacturing a semiconductor device according to a first embodiment of the present invention.

The invention will be now described herein with reference to illustrative embodiments. Those skilled in the art will recognize that many alternative embodiments can be accomplished using the teachings of the present invention and that the invention is not limited to the embodiments illustrated for explanatory purposes.

Embodiments of the present invention will be described below with reference to the accompanying drawings. Those drawings are used in the following description only for the purpose of explaining embodiments of the present invention. Therefore, the size, thickness, and dimension of each illustrated component may be different from those of a corresponding component in an actual semiconductor device.

First Embodiment

FIGS. 1A, 1B, 1C, and 1D to FIGS. 15A and 15B are diagrams showing a manufacturing process of a semiconductor device according to a first embodiment of the present invention.

A method of manufacturing a semiconductor device 10 (see FIG. 15B) according to the first embodiment of the present invention will be described below with reference to FIGS. 1A to 15B.

First, a monocrystalline silicon substrate is prepared as a substrate 12 in a step illustrated with FIGS. 1A, 1B, 1C, and 1D. Then a silicon oxide film 11 is formed as an etching stopper film on a principal surface 12a of the substrate 12. For example, the silicon oxide film 11 has a thickness of about 5 nm.

Then device isolation regions 13 are formed in the principal surface 12a of the substrate 12 with a depth of $D_1$ by using a well-known STI (shallow trench isolation) technique. The device isolation regions 13 have a line and space pattern (L/S pattern) and extend along the X-direction, which extends across insulating isolation portions (isolation portions) 24 shown in FIG. 6B. Thus, belt-like (strip-shaped) active regions 14 are defined so as to extend along the X-direction. As shown in FIG. 1C, the depth $D_1$ of the device isolation regions 13 is defined as a depth measured from the principal surface 12a of the substrate 12.

The device isolation regions 13 are formed by filling trenches (or grooves) formed in the substrate 12 with a silicon oxide film ($SiO_2$ film). Furthermore, upper surfaces 13a of the device isolation regions 13 are flush with an upper surface 11a of the silicon oxide film 11.

Figure 6A:
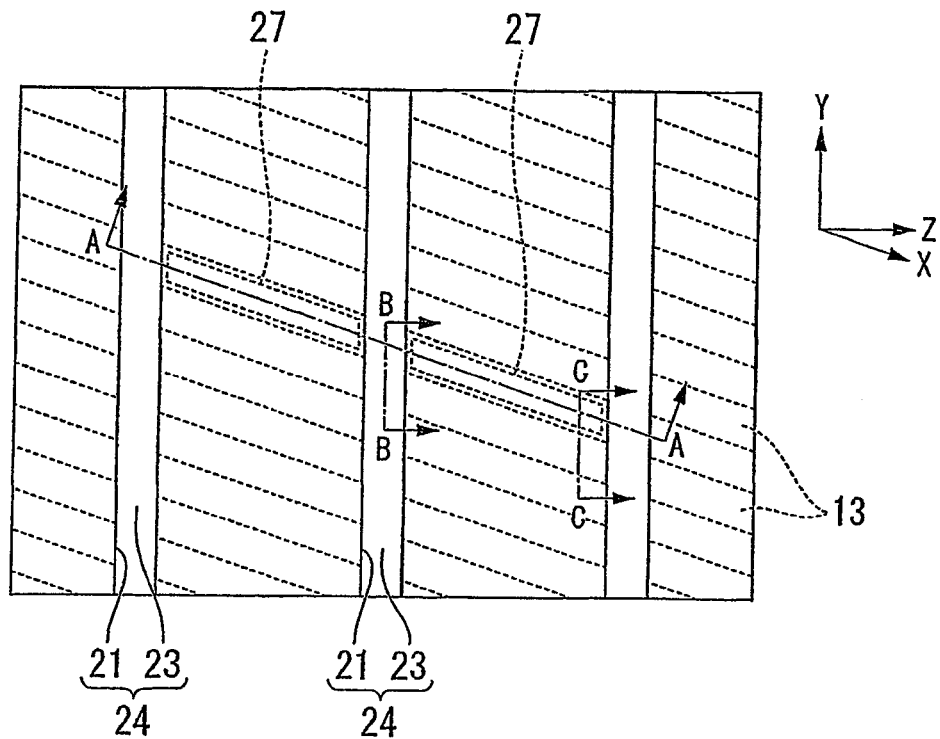
FIG. 6A is a plan view showing a step of manufacturing a semiconductor device following the step illustrated with FIG. 5A.

As shown in FIG. 6A, which will be described later, the device isolation regions 13 define active regions 27 along with the insulating isolation portions 24. In other words, active regions 27 shown in FIG. 6A are formed by dividing the belt-like active regions 14 into a plurality of segments in the X-direction.

In the first embodiment, a p-type monocrystalline silicon substrate is used as an example of the substrate 12. Nevertheless, the substrate 12 is not limited to a monocrystalline silicon substrate.

The Y-direction of FIG. 1A represents a direction in which trench-shaped insulating isolation portions 24 shown in FIG. 6A extend. The Y-direction of FIG. 1A also represents a direction in which gate electrodes 53 shown in FIGS. 14A and 14B, which will be described later, extend.

Furthermore, the Z-direction of FIG. 1A represents a direction in which bit lines 58 formed by a step illustrated with FIGS. 14A, 14B, 14C, and 14D extend.

In a subsequent step illustrated with FIGS. 2A, 2B, 2C, and 2D, a sacrifice film 15 is formed so that the upper surface 11a of the silicon oxide film 11 and the upper surfaces 13a of the device isolation regions 13 are covered with the sacrifice film 15. Thereafter, an amorphous carbon film 16 is formed so that a surface 15a of the sacrifice film 15 is covered with the amorphous carbon film 16.

The sacrifice film 15 is removed by wet etching in a step illustrated with FIGS. 7A, 7B, 7C, and 7D, which will be described later.

Figure 7A:
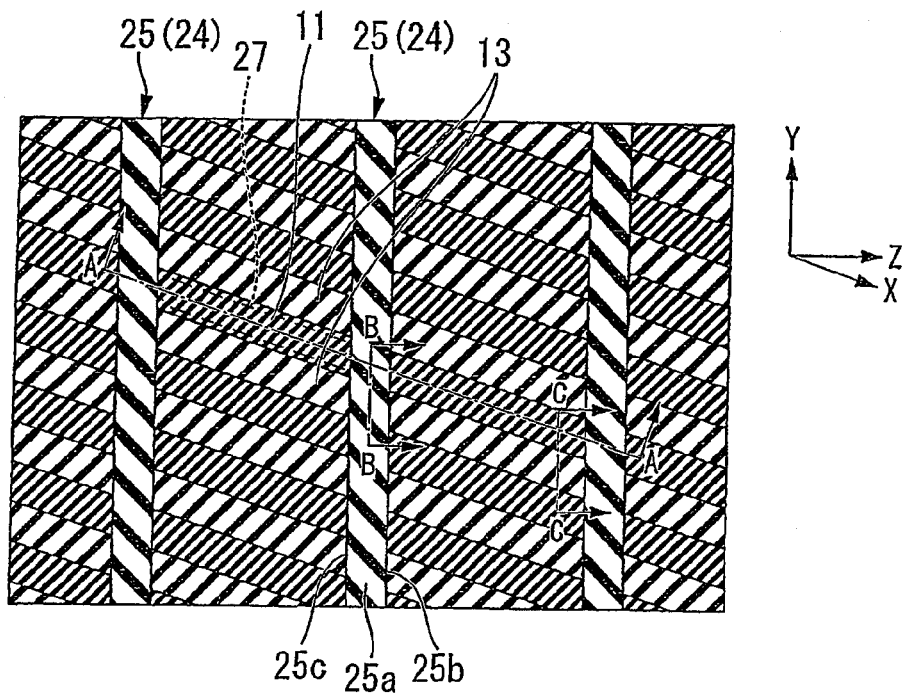
FIG. 7A is a plan view showing a step of manufacturing a semiconductor device following the step illustrated with FIG. 6A.
Figure 7B:
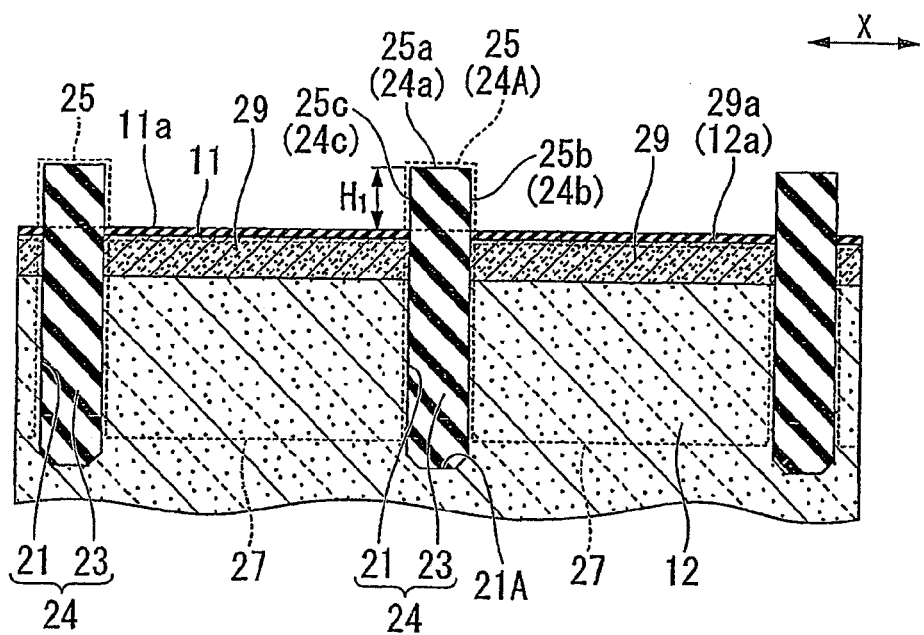
FIG. 7B is a cross-sectional view taken along line A-A of FIG. 7A.
Figure 7C:
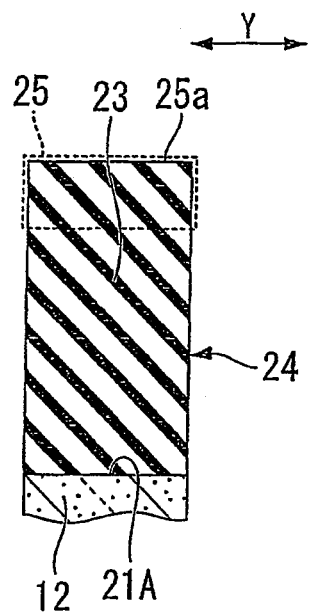
FIG. 7C is a cross-sectional view taken along line B-B of FIG. 7A.
Figure 7D:
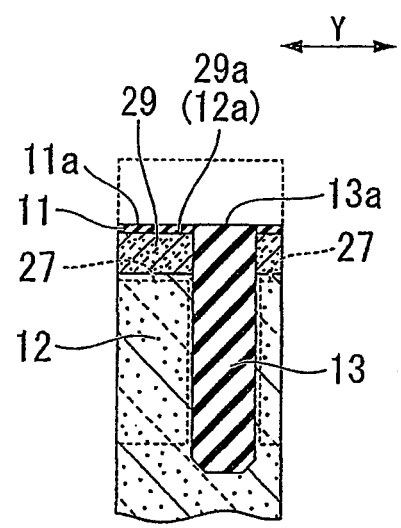
FIG. 7D is a cross-sectional view taken along line C-C of FIG. 7A.

Therefore, the sacrifice film 15 is formed of a film that can selectively be removed in contrast to active regions 27 of a monocrystalline silicon substrate shown in FIG. 7B, a first insulator film 23 (silicon nitride film (SiN film)) of insulating isolation portions 24 shown in FIG. 7B, and a silicon oxide film ($SiO_2$ film) of device isolation regions shown in FIG. 7D.

Specifically, a doped polysilicon film is formed as the sacrifice film 15. The sacrifice film 15 is formed such that the thickness $M_1$ of the sacrifice film 15 is equal to or greater than distances E from sidewalls 25b and 25c of projection portions (elongated projection portions) 25 of insulating isolation portions 24 to sidewalls 45b of first trenches 45 shown in FIG. 13B, which will be described later.

Figure 2A:
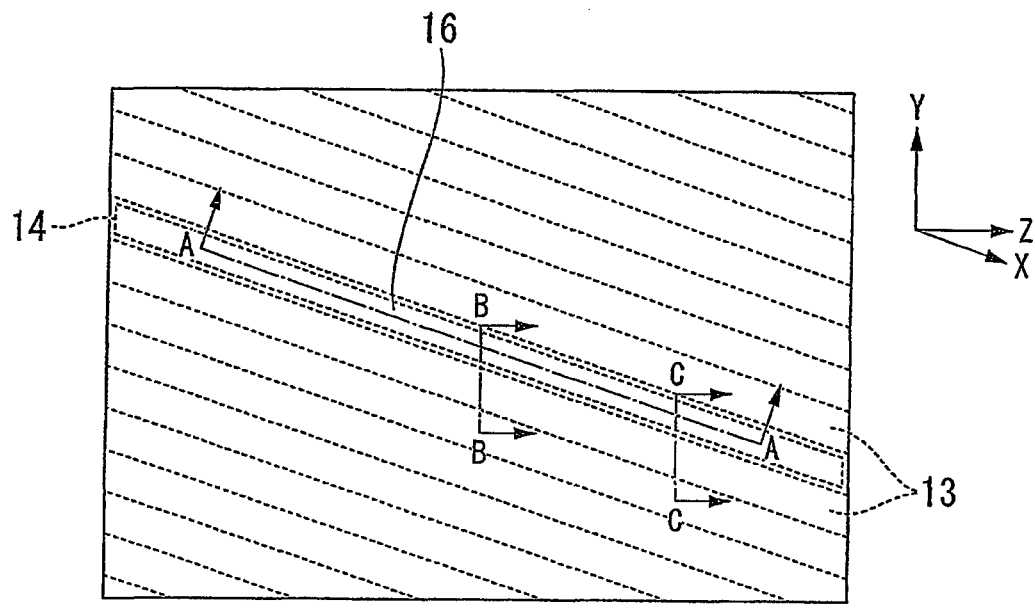
FIG. 2A is a plan view showing a step of manufacturing a semiconductor device following the step illustrated with FIG. 1A.
Figure 2B:
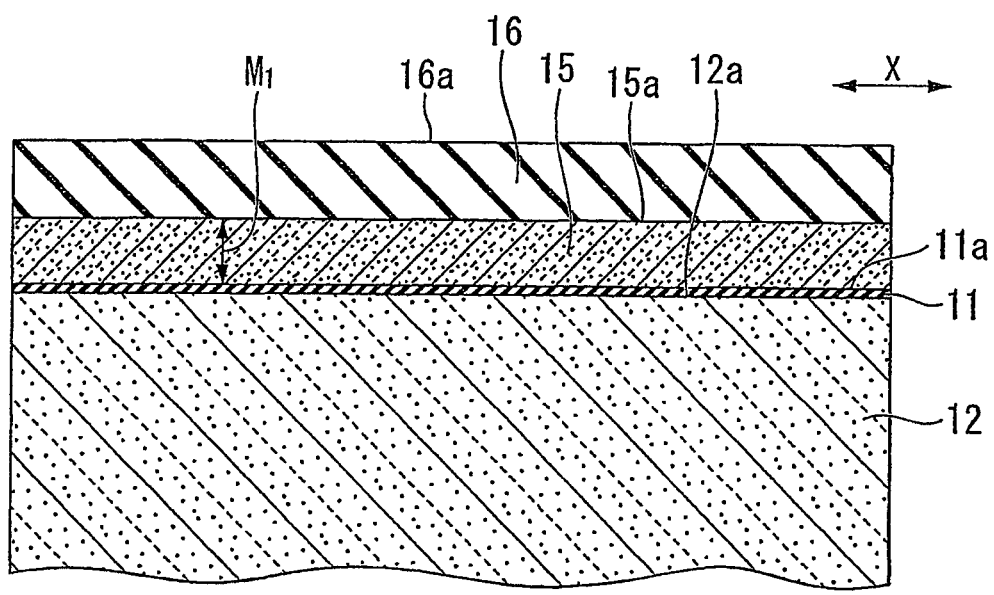
FIG. 2B is a cross-sectional view taken along line A-A of FIG. 2A.
Figure 2C:
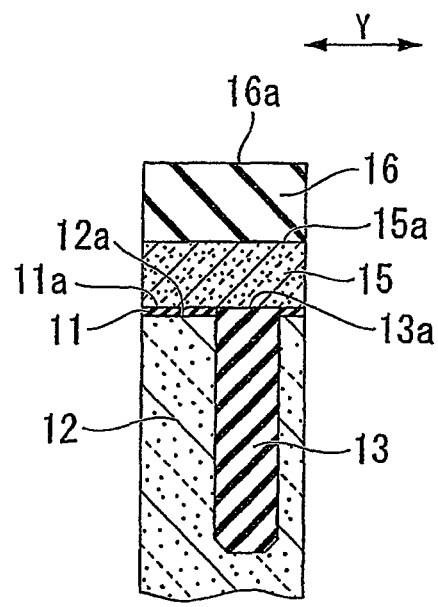
FIG. 2C is a cross-sectional view taken along line B-B of FIG. 2A.
Figure 2D:
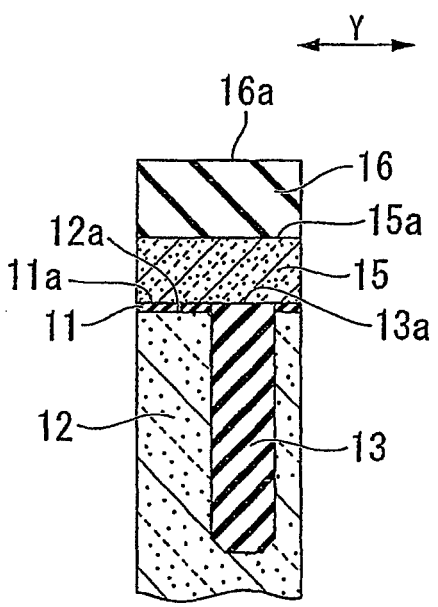
FIG. 2D is a cross-sectional view taken along line C-C of FIG. 2A.
Figure 6B:
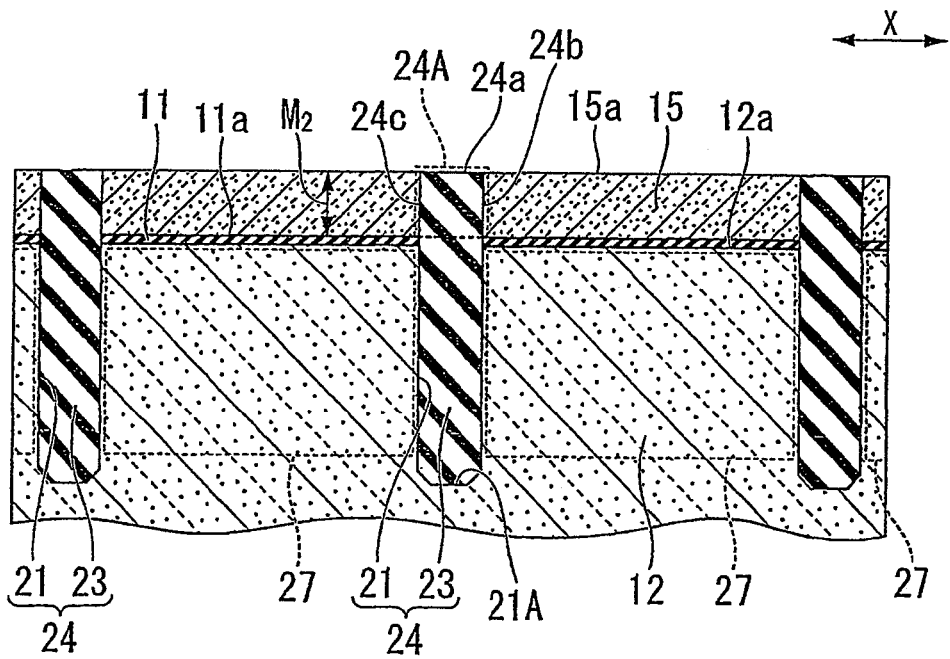
FIG. 6B is a cross-sectional view taken along line A-A of FIG. 6A.
Figure 6C:
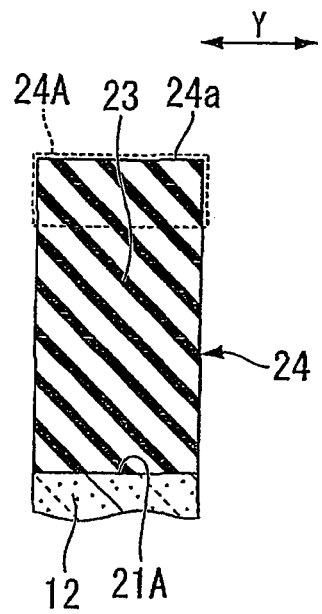
FIG. 6C is a cross-sectional view taken along line B-B of FIG. 6A.
Figure 6D:
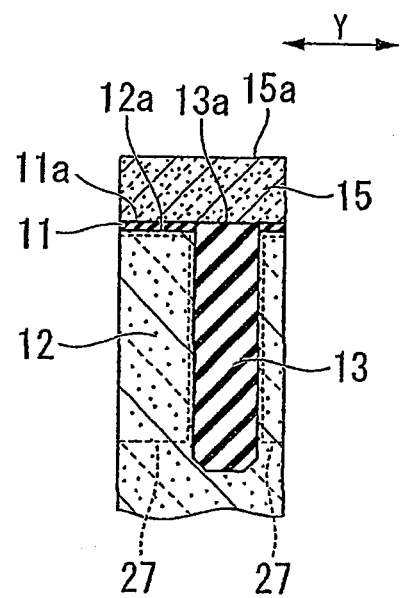
FIG. 6D is a cross-sectional view taken along line C-C of FIG. 6A.

Furthermore, if the thickness $M_2$ of the sacrifice film 15 shown in FIG. 6B, which will be described later, is equal to the thickness $M_1$ of the sacrifice film 15 shown in FIG. 2B and, as shown in FIG. 6B, upper surfaces 24a of insulating isolation portions 24 accord with the surface 15a of the sacrifice film 15, then the height $H_1$ of projection portions 25 shown in FIG. 7B can be adjusted to have a desired value by controlling the thickness $M_1$ of the sacrifice film 15.

The first embodiment will be described with an example in which a doped polysilicon film is formed as the sacrifice film 15.

The sacrifice film 15 is not limited to a doped polysilicon film and may be any film that can selectively be removed in contrast to active regions 27 of a monocrystalline silicon substrate shown in FIG. 7B, a first insulator film 23 (silicon nitride film (SiN film)) of insulating isolation portions 24 shown in FIG. 7B, and a silicon oxide film ($SiO_2$ film) of device isolation regions 13 shown in FIG. 7D.

Figure 1B:
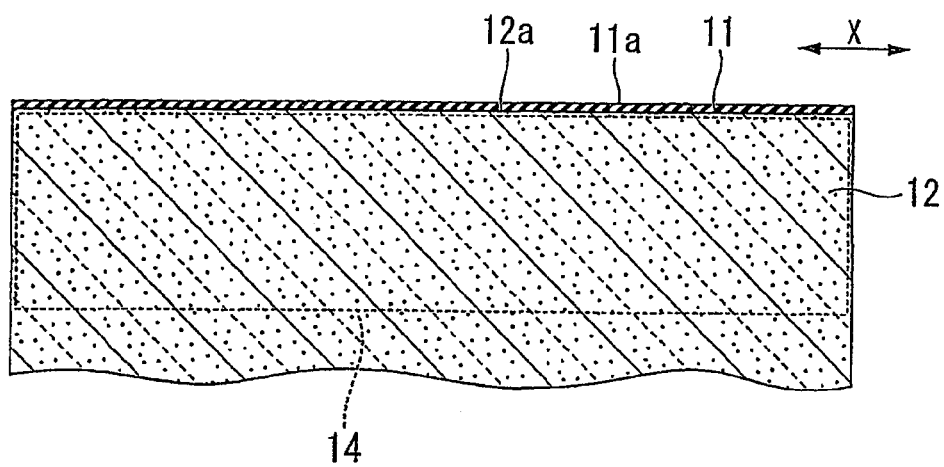
FIG. 1B is a cross-sectional view taken along line A-A of FIG. 1A.
Figure 1C:
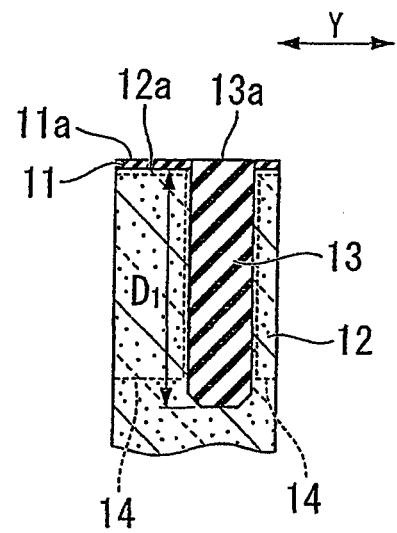
FIG. 1C is a cross-sectional view taken along line B-B of FIG. 1A.
Figure 1D:
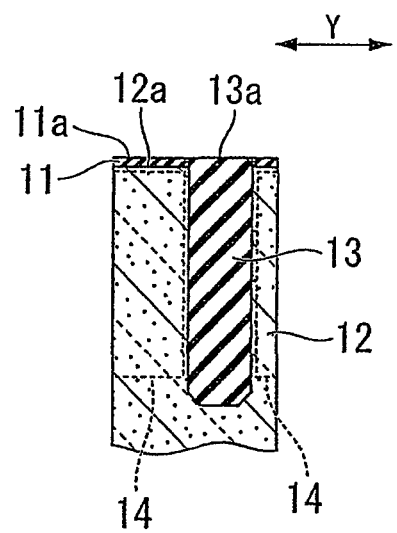
FIG. 1D is a cross-sectional view taken along line C-C of FIG. 1A.

If the selectivity of the sacrifice film 15 is concerned upon removal of the sacrifice film 15, an etching stopper film may be inserted. In the first embodiment, as shown in FIGS. 1B, 1C, and 1D, the silicon oxide film 11 (etching stopper film) is formed on the substrate 12 with a thickness of about 5 nm for the purpose of providing a function of such an etching stopper.

In a subsequent step illustrated with FIGS. 3A, 3B, 3C, and 3D, a resist film 18 for etching is formed on a surface 16a of the amorphous carbon film 16 with a plurality of opening trenches (windows) 18A being formed therein by using a photolithography technique. The opening trenches 18A extend along the Y-direction and allow the surface 15a of the sacrifice film 15 to be exposed.

Then part of the amorphous carbon film 16 that is located below the opening trenches 18A is removed by anisotropic dry etching using the resist film 18 as a mask. Thus, opening trenches 16A are formed so as to extend along the Y-direction. The opening trenches 16A allow the surface 15a of the sacrifice film 15 to be exposed.

Figure 14A:
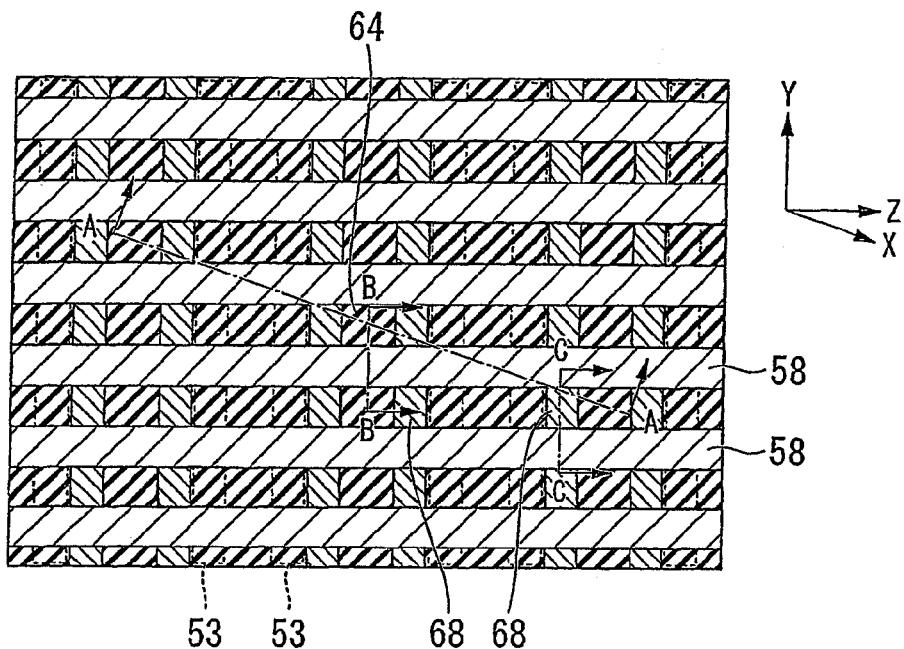
FIG. 14A is a plan view showing a step of manufacturing a semiconductor device following the step illustrated with FIG. 13A.

At that time, a plurality of opening trenches 16A are formed so that those opening trenches 16A are arranged at predetermined intervals along the Z-direction (a direction in which bit lines 58 shown in FIG. 14A extend).

Figure 3A:
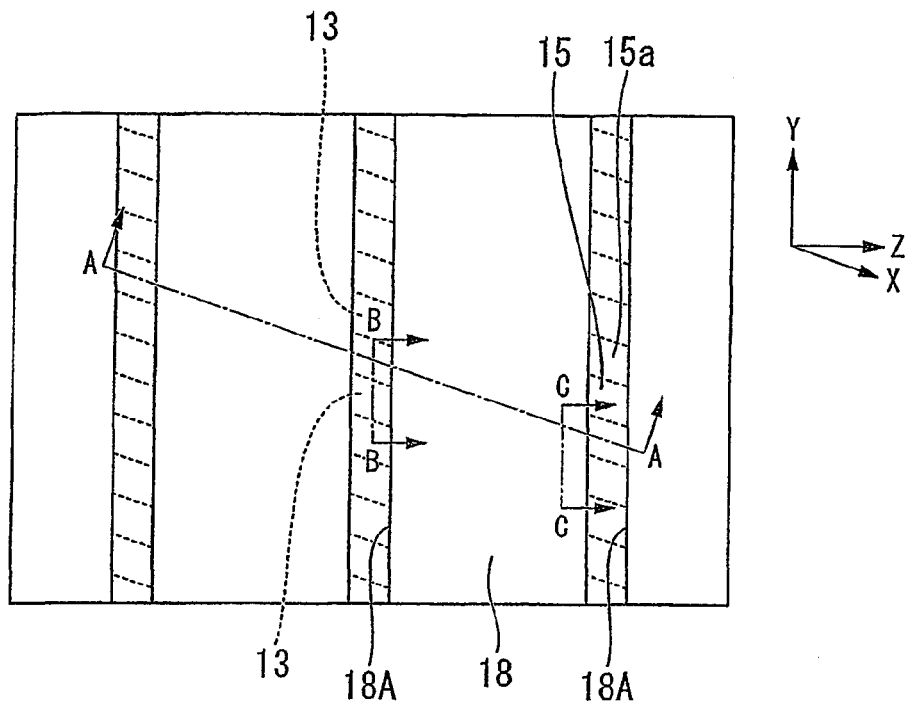
FIG. 3A is a plan view showing a step of manufacturing a semiconductor device following the step illustrated with FIG. 2A.
Figure 3B:
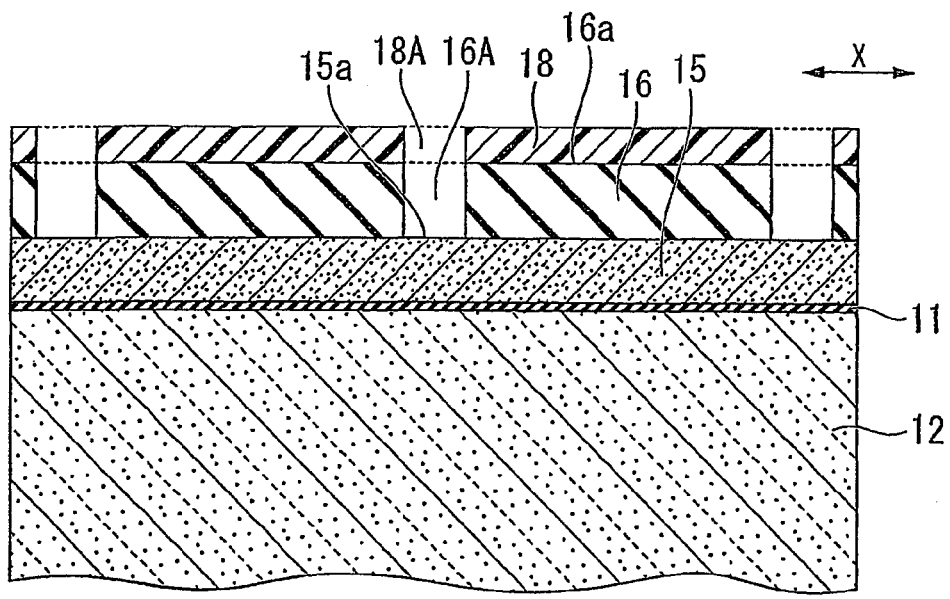
FIG. 3B is a cross-sectional view taken along line A-A of FIG. 3A.
Figure 3C:
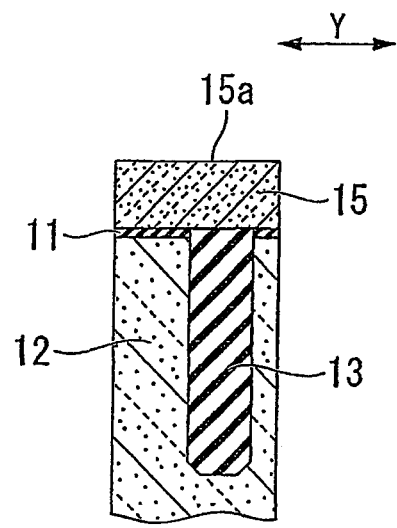
FIG. 3C is a cross-sectional view taken along line B-B of FIG. 3A.
Figure 3D:
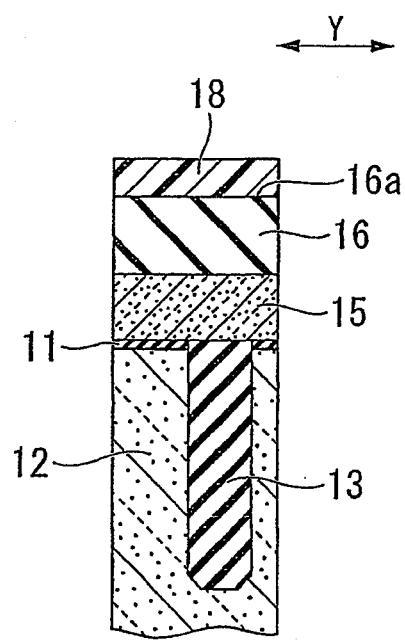
FIG. 3D is a cross-sectional view taken along line C-C of FIG. 3A.
Figure 4A:
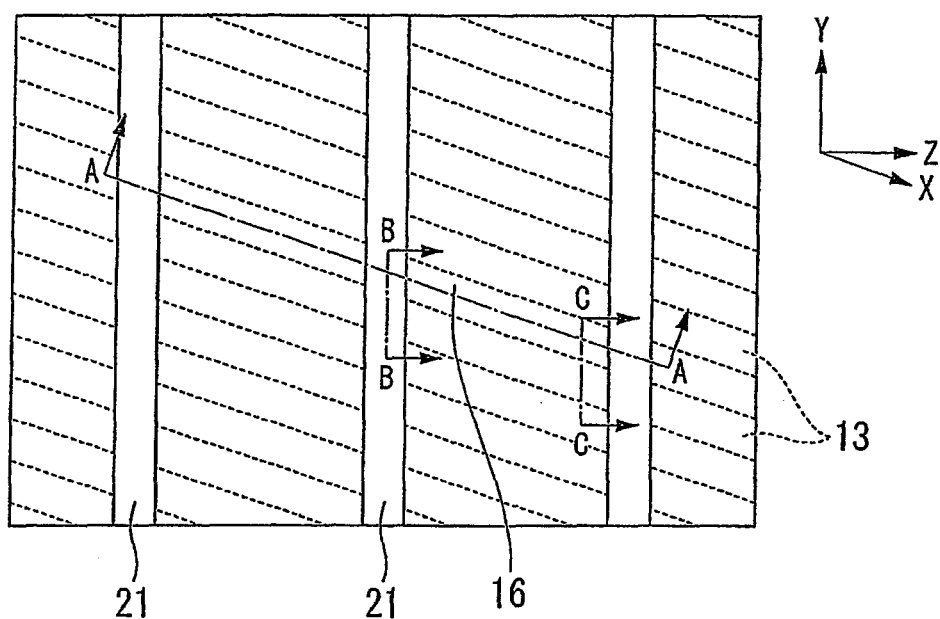
FIG. 4A is a plan view showing a step of manufacturing a semiconductor device following the step illustrated with FIG. 3A.
Figure 4B:
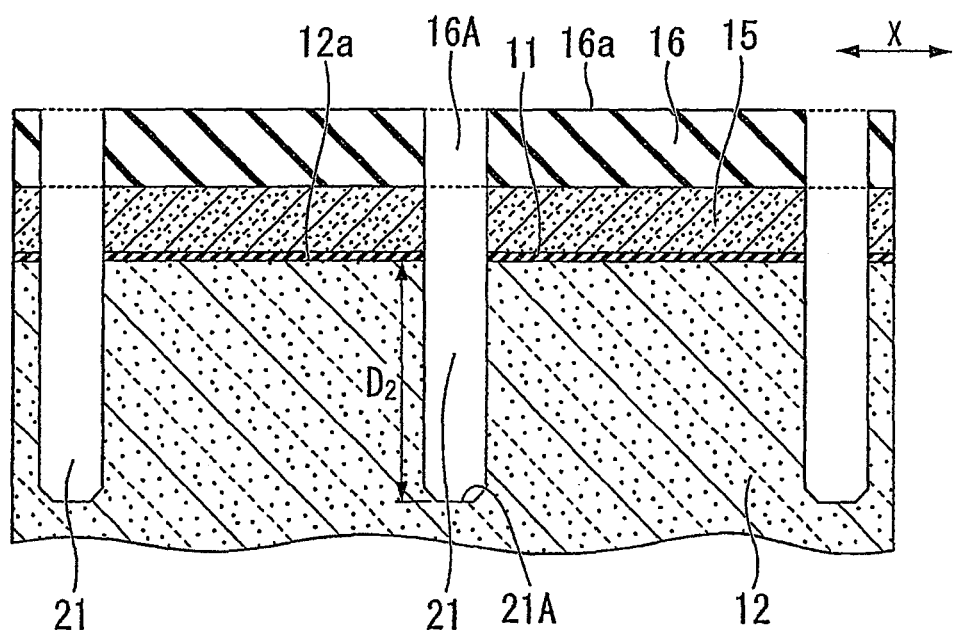
FIG. 4B is a cross-sectional view taken along line A-A of FIG. 4A.
Figure 4C:
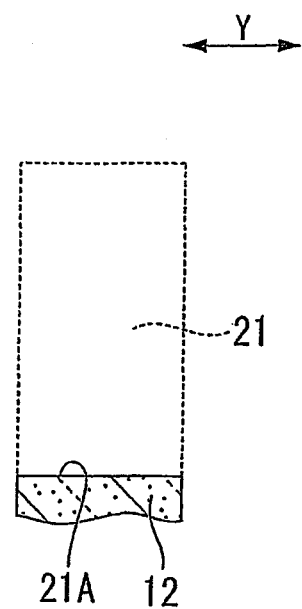
FIG. 4C is a cross-sectional view taken along line B-B of FIG. 4A.
Figure 4D:
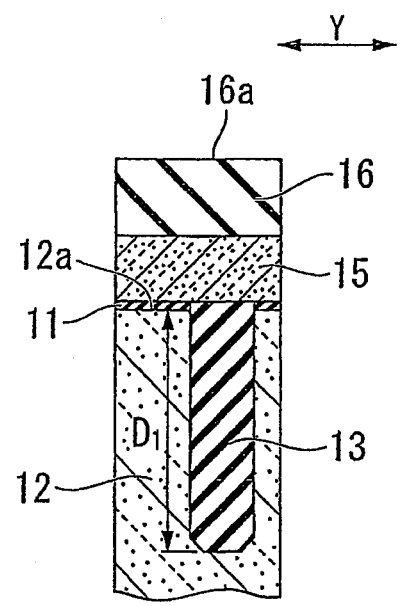
FIG. 4D is a cross-sectional view taken along line C-C of FIG. 4A.
Figure 5A:
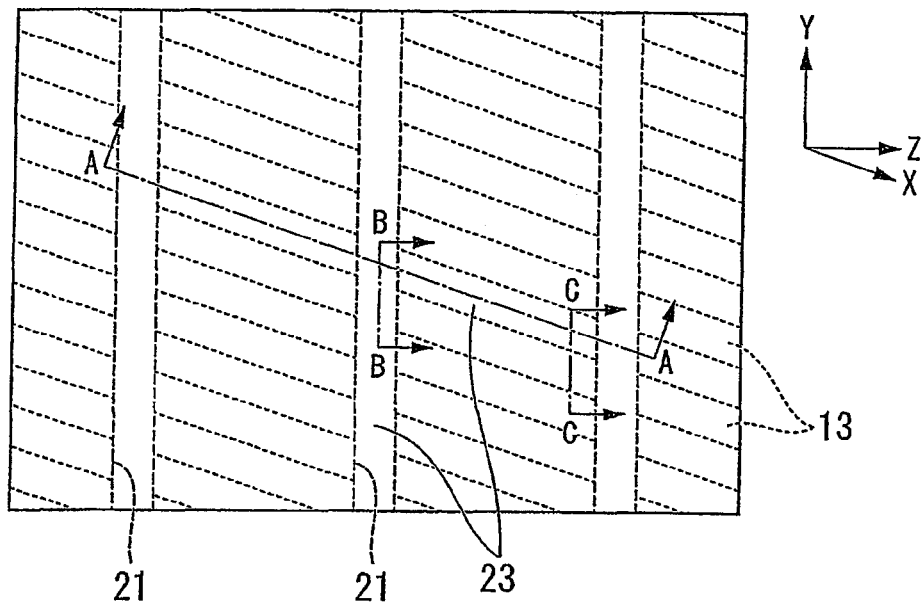
FIG. 5A is a plan view showing a step of manufacturing a semiconductor device following the step illustrated with FIG. 4A.
Figure 5B:
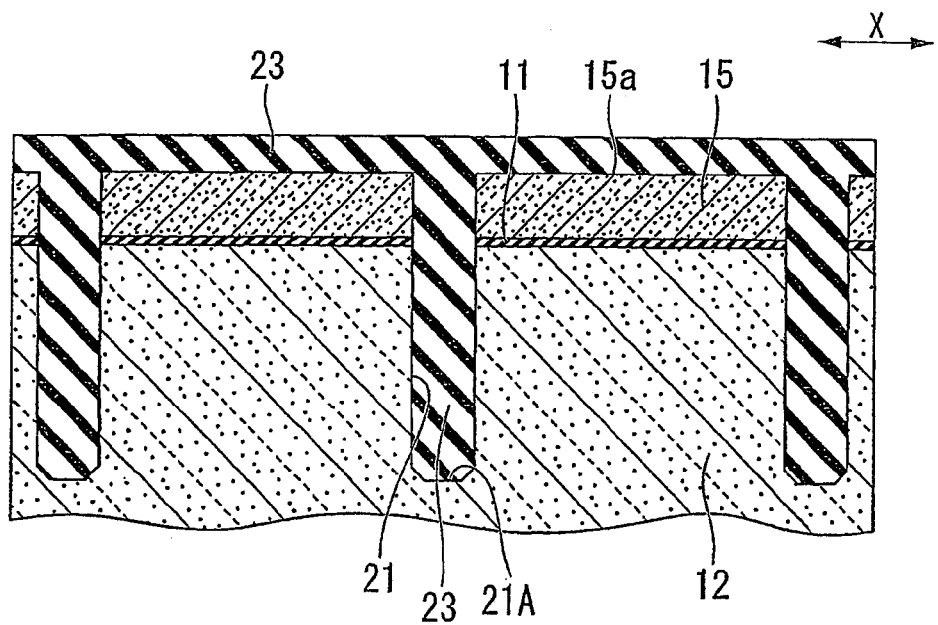
FIG. 5B is a cross-sectional view taken along line A-A of FIG. 5A.
Figure 5C:
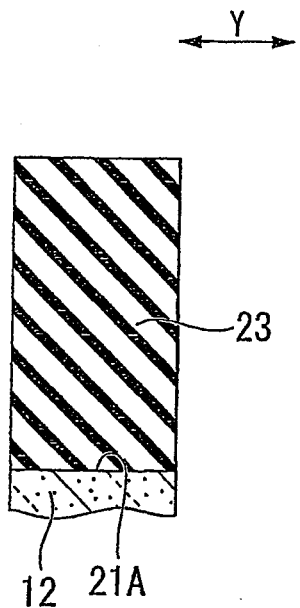
FIG. 5C is a cross-sectional view taken along line B-B of FIG. 5A.
Figure 5D:
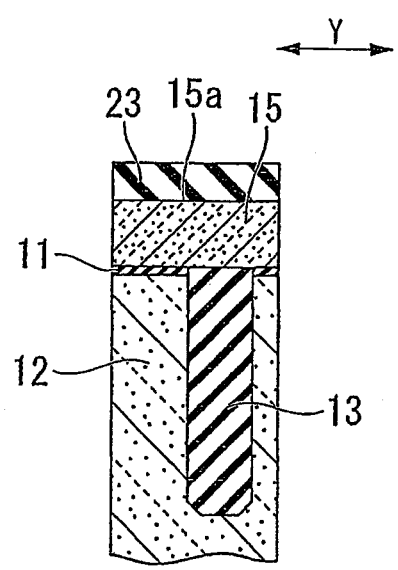
FIG. 5D is a cross-sectional view taken along line C-C of FIG. 5A.

In a subsequent step illustrated with FIGS. 4A, 4B, 4C, and 4D, the resist film 18 shown in FIGS. 3A, 3B, and 3D is removed.

Then separation trenches (grooves) 21 are formed so as to extend through the sacrifice film 15 and the silicon oxide film 11 and partway dig the substrate 12, which is located below the sacrifice film 15.

Specifically, the separation trenches 21 are formed as follows: Part of the sacrifice film 15 that is located below the opening trenches 16A is removed by anisotropic dry etching by using the amorphous carbon film 16 having the opening trenches 16A formed therein as a mask. Part of the substrate 12 that is located below the opening trenches 16A is etched partially. Thus, a plurality of separation trenches 21 are formed.

For example, the depth $D_2$ of the separation trenches 21 may be made equal to the depth $D_1$ of the device isolation regions 13. The depth $D_2$ of the separation trenches 21 is defined as a depth measured from the principal surface 12a of the substrate 12 to a bottom 21A of the separation trench 21.

In a subsequent step illustrated with FIGS. 5A, 5B, 5C, and 5D, a first insulator film 23 is deposited so that the separation trenches 21 are filled with the first insulator film 23.

It is preferable to use, as the first insulator film 23, a film that is hardly etched when first trenches 45 are formed by etching the device isolation regions 13 of a silicon oxide film ($SiO_2$ film) and the active regions 27 of a monocrystalline silicon substrate in a step illustrated with FIGS. 13A, 13B, 13C, and 13D.

Thus, in the step illustrated with FIGS. 5A, 5B, 5C, and 5D, a film having a high etching selectivity to the device isolation regions 13 (silicon oxide film ($SiO_2$ film)) and the active regions 27 (silicon (Si)) is deposited as the first insulator film 23.

More specifically, a silicon nitride film (SiN film) is deposited so as to form the first insulator film 23. At that time, the first insulator film 23 of a silicon nitride film (SiN film) is also formed on the surface 15a of the sacrifice film 15.

The first insulator film 23 is not limited to a silicon nitride film (SiN film) and may be any film having a high etching selectivity to the device isolation regions 13 and the active regions 27.

In a subsequent step illustrated with FIGS. 6A, 6B, 6C, and 6D, unnecessary part of the first insulator film 23 that has been formed above the surface 15a of the sacrifice film 15 shown in FIGS. 5A, 5B, 5C, and 5D is removed.

Specifically, for example, the sacrifice film 15 shown in FIGS. 5A, 5B, 5C, and 5D is etched back by anisotropic dry etching, so that the unnecessary part of the first insulator film 23 is removed.

Thus, a plurality of insulating isolation portions 24 are formed by the first insulator film 23. The insulating isolation portions 24 have upper surfaces 24a that are flush with the surface 15a of the sacrifice film 15. The insulating isolation portions 24 are filled in the separation trenches 21 from the bottoms 21A of the separation trenches 21 to the surface 15a of the sacrifice film 15.

At that time, the insulating isolation portions 24 are defined by trenches extending along the Y-direction. Thus, the insulating isolation portions 24 sever the device isolation regions 13, which extend along the X-direction. Furthermore, the insulating isolation portions 24 are arranged at predetermined intervals along the X-direction.

At this stage, sidewalls 24b and 24c of an upper portion 24A of each of the insulating isolation portions 24 are covered with the sacrifice film 15.

In the step illustrated with FIGS. 6A, 6B, 6C, and 6D, an unnecessary part of the first insulator film 23 may be removed by chemical mechanical polishing (CMP) and subsequent etching-back.

In this case, the thickness $M_2$ of the sacrifice film 15 remaining on the upper surface 11a of the silicon oxide film 11 can be controlled by polishing the first insulator film 23 and the sacrifice film 15 during the CMP process.

The thickness $M_2$ of the sacrifice film 15 remaining on the upper surface 11a of the silicon oxide film 11 is equal to the height $H_1$ of the projection portions 25 formed by a step illustrated with FIGS. 7A, 7B, 7C, and 7D, which will be described later. Specifically, control of the thickness $M_2$ of the sacrifice film 15 by the CMP process allows the height $H_1$ of the projection portions 25 shown in FIG. 7B to be adjusted into a desired value. The height $H_1$ of the projection portions 25 is defined as a height measured from the upper surface 11a of the silicon oxide film 11.

Furthermore, in FIG. 6B, each of the insulating isolation portions 24 is formed by filling part of the separation trench 21 with the first insulator film 23 from a bottom 21A of the separation trench 21 to the surface 15a of the sacrifice film 15. Nevertheless, each of the insulating isolation portions 24 may be formed by filling part of the separation trench 21 with the first insulator film 23 from the bottom 21A of the separation trench 21 to a height that is on or above the upper surface 11a of the silicon oxide film 11 and is on or below the surface 15a of the sacrifice film 15. If no silicon oxide film 11 is formed, the separation trenches 21 are filled with the first insulator film 23 from the bottoms 21A of the separation trenches 21 to a height that is on or above the principal surface 12a of the substrate 12 and is on or below the surface 15a of the sacrifice film 15.

In a subsequent step illustrated with FIGS. 7A, 7B, 7C, and 7D, the sacrifice film 15 is removed, so that the upper portions 24A of the insulating isolation portions 24, which have been covered with the sacrifice film 15, are exposed. Thus, projection portions 25 are formed so as to project upward from the principal surface 12a of the substrate 12.

At that time, the projection portions 25 are formed such that the height $H_1$ of the projection portions 25 is greater than the thickness $M_3$ of a protective film 32 illustrated in FIG. 8B, which will be described later. The thickness $M_3$ of the protective film 32 is defined as a thickness measured from an upper surface of each of the projection portions 25.

Specifically, when the sacrifice film 15 is formed of a doped polysilicon film, the sacrifice film 15 is removed by wet etching with use of ammonia water. Thus, the upper surface 11a of the silicon oxide film 11 and the upper surfaces 13a of the device isolation regions 13 are exposed (see FIG. 7D).

Ammonia water can remove a doped polysilicon film with a high selectivity to a silicon oxide film ($SiO_2$ film). Therefore, wet etching with ammonia water can remove the sacrifice film 15 with leaving the silicon oxide film 11 and the insulating isolation portion 24, which are located right below the sacrifice film 15.

Each of the projection portions 25 has a flat upper surface 25a extending along the Y-direction (an upper surface 24a of the upper portion 24A of the insulating isolation portion 24), a sidewall (side surface) 25b extending along the Y-direction (a sidewall 24b of the upper portion 24A of the insulating isolation portion 24), a sidewall (side surface) 25c extending along the Y-direction (a sidewall 24c of the upper portion 24A of the insulating isolation portion 24). The sidewalls 25b and 25c are arranged so as to be opposed to each other.

The height $H_1$ of the projection portions 25 is equal to the thickness $M_2$ of the sacrifice film 15 to be removed (see FIG. 6B). In other words, the height $H_1$ of the projection portions 25 is determined by the thickness $M_2$ of the sacrifice film 15 to be removed.

Then impurity diffusion regions (diffusion regions) 29 are formed in the active regions 27. Each of the impurity diffusion regions 29 has an upper surface 29a that is flush with the principal surface 12a of the substrate 12.

Specifically, for example, phosphorus (P) and arsenic (As) are implanted as impurities into the active regions 27 by an ion implantation method, so that impurity diffusion regions 29 having an impurity concentration of $1E17/cm^3$ to $5E18/cm^3$ can be formed.

In a subsequent step illustrated with FIGS. 8A, 8B, 8C, and 8D, a protective film 32 is formed on the upper surface 11a of the silicon oxide film 11 and the upper surfaces 13a of the device isolation regions 13 so that the projection portions 25 are covered in a conformal manner with the protective film 32.

When the protective film 32 is formed on the upper surface 11a of the silicon oxide film 11 and the upper surfaces 13a of the device isolation regions 13 so that the projection portions 25 are covered in a conformal manner with the protective film 32, second trenches 33 are formed in the protective film 32 between the projection portions 25 so as to extend along the Y-direction.

Figure 9A:
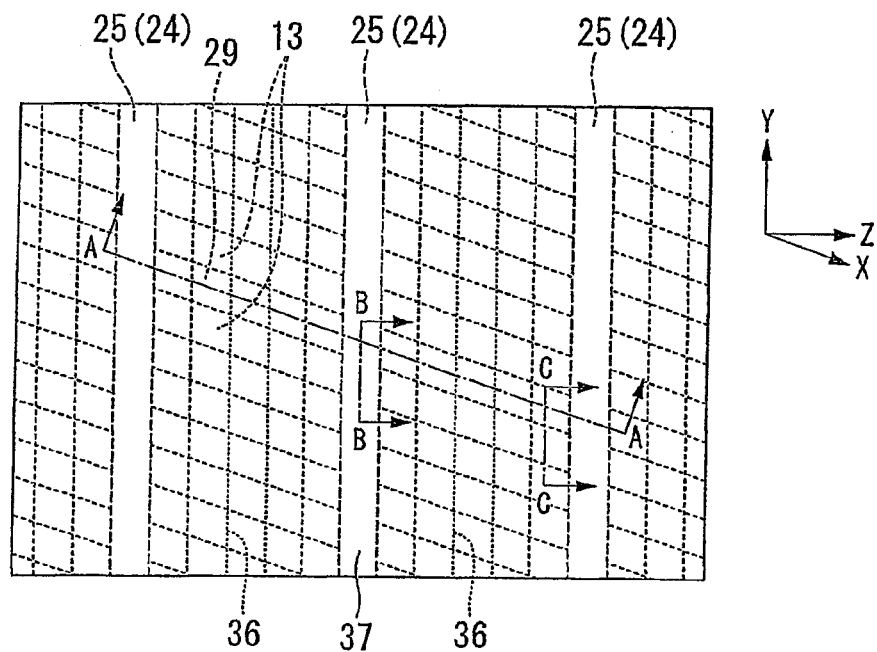
FIG. 9A is a plan view showing a step of manufacturing a semiconductor device following the step illustrated with FIG. 8A.
Figure 9B:
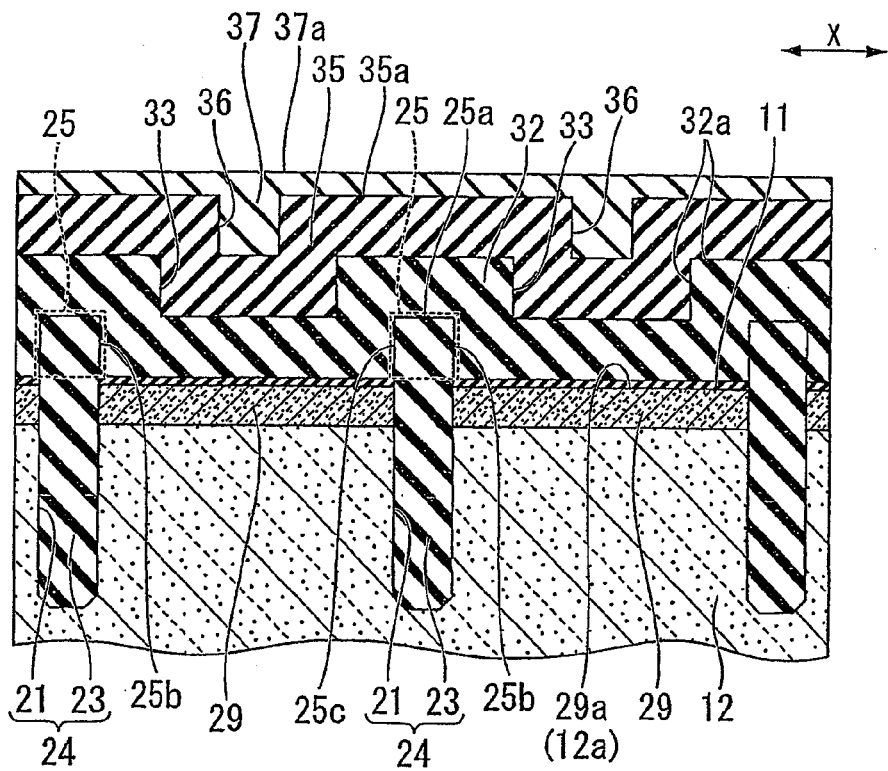
FIG. 9B is a cross-sectional view taken along line A-A of FIG. 9A.
Figure 9C:
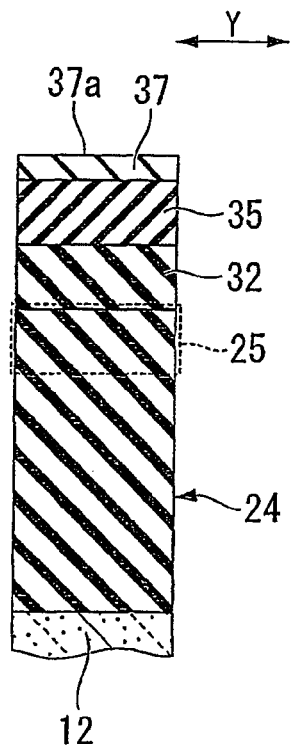
FIG. 9C is a cross-sectional view taken along line B-B of FIG. 9A.
Figure 9D:
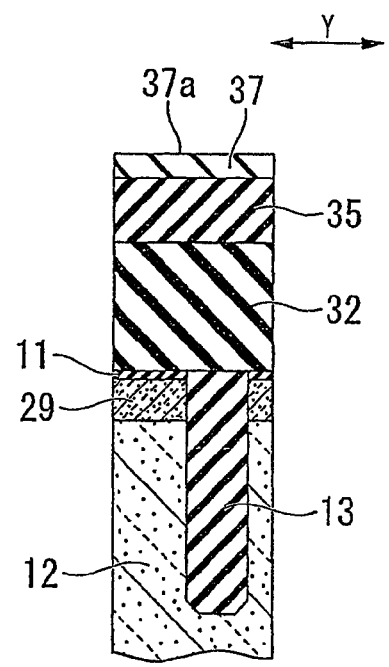
FIG. 9D is a cross-sectional view taken along line C-C of FIG. 9A.
Figure 10A:
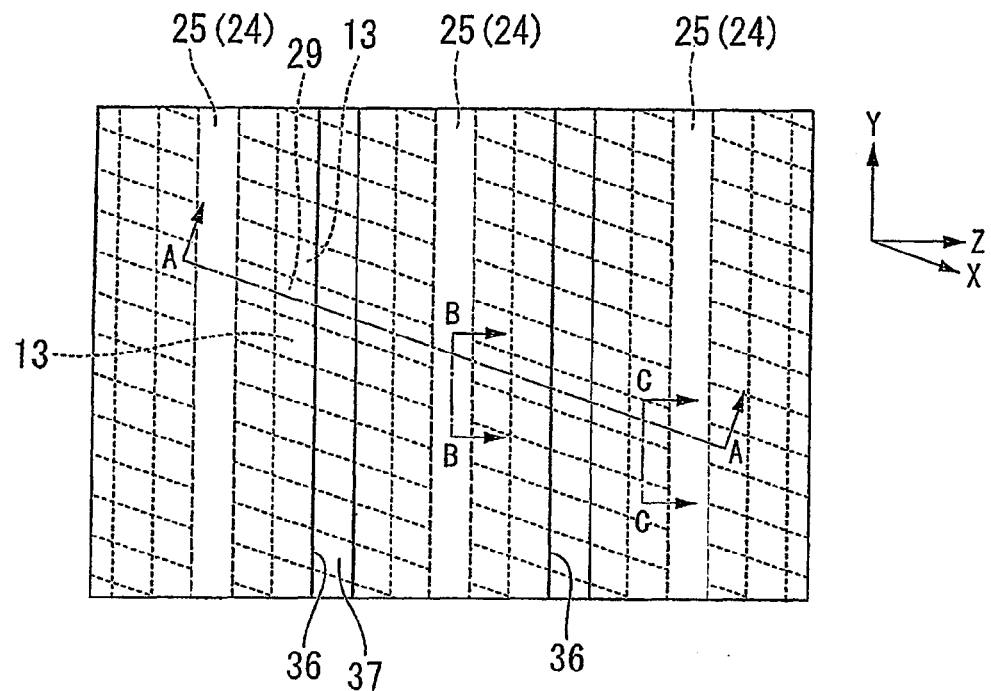
FIG. 10A is a plan view showing a step of manufacturing a semiconductor device following the step illustrated with FIG. 9A.
Figure 10B:
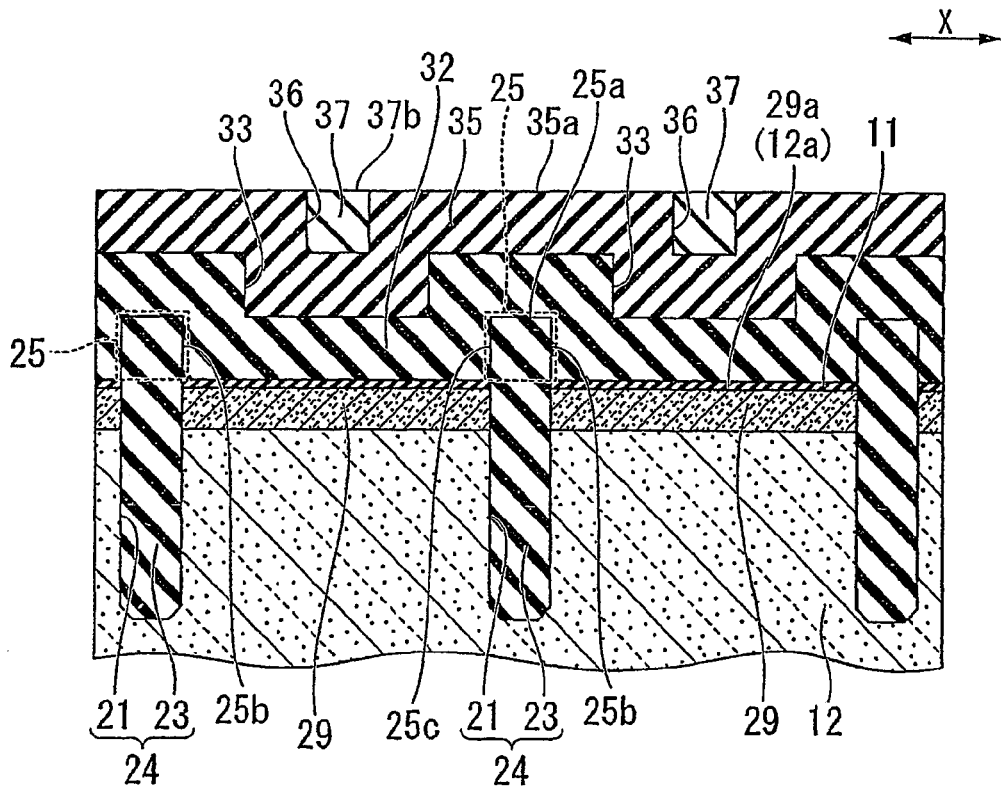
FIG. 10B is a cross-sectional view taken along line A-A of FIG. 10A.
Figure 10C:
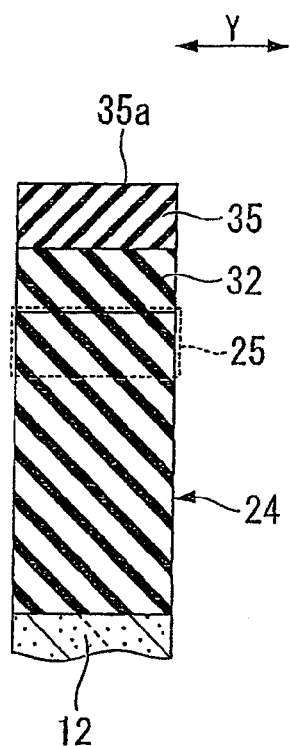
FIG. 10C is a cross-sectional view taken along line B-B of FIG. 10A.
Figure 10D:
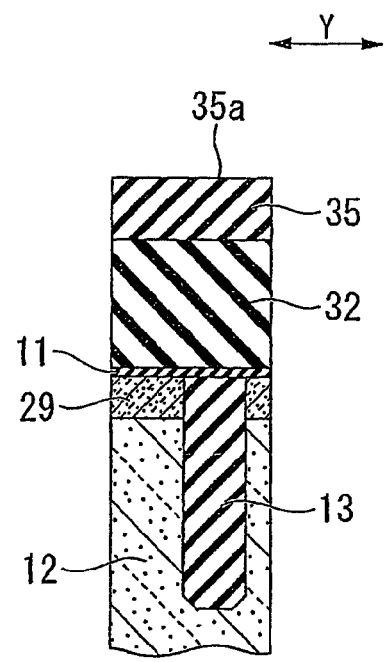
FIG. 10D is a cross-sectional view taken along line C-C of FIG. 10A.
Figure 11A:
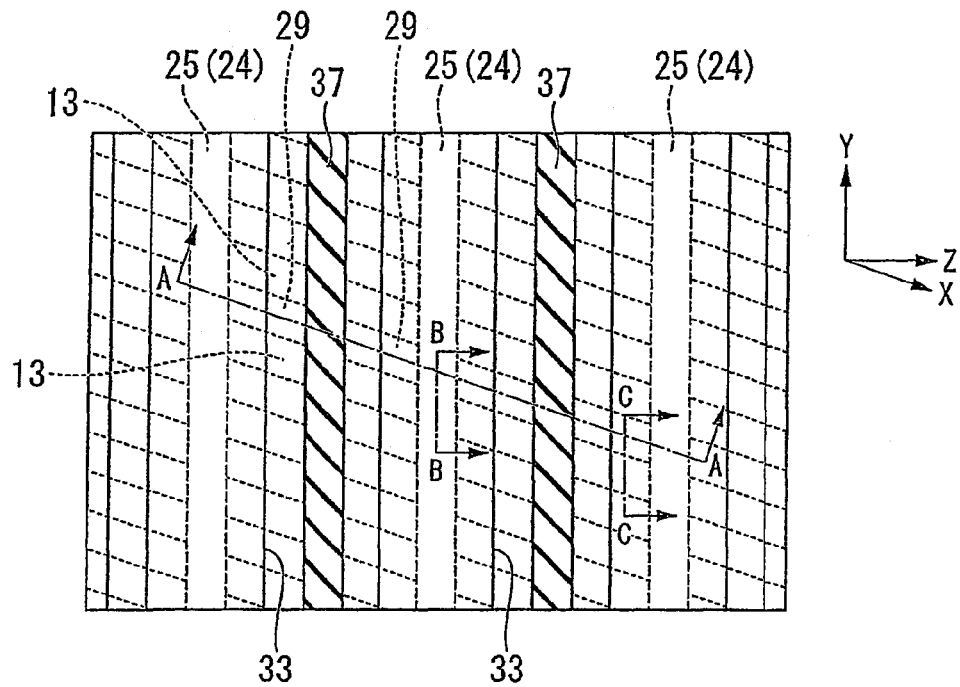
FIG. 11A is a plan view showing a step of manufacturing a semiconductor device following the step illustrated with FIG. 10A.
Figure 11B:
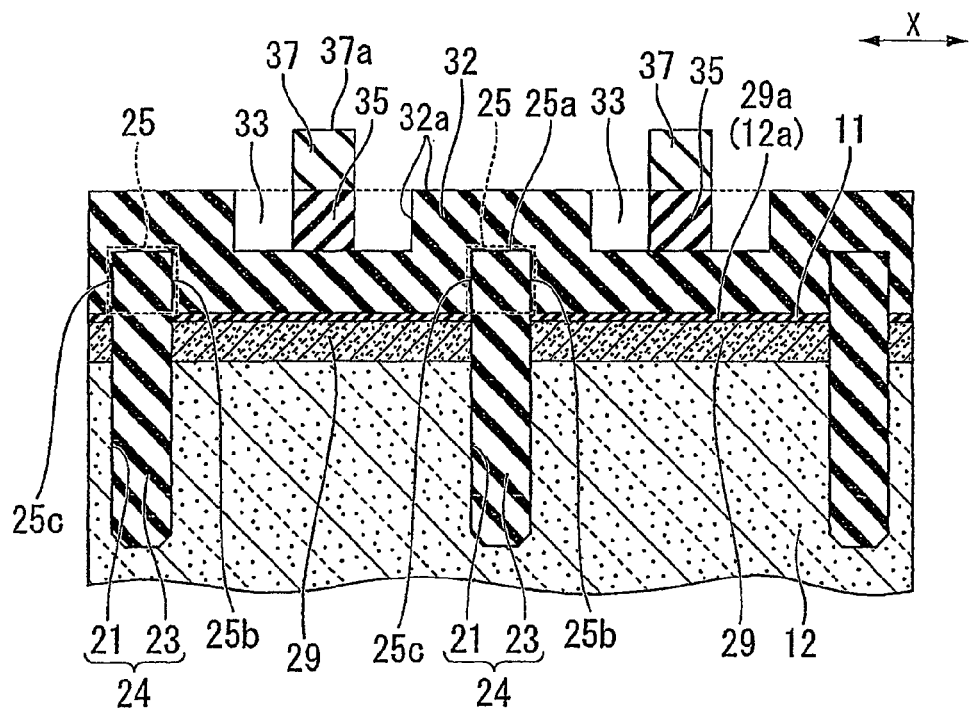
FIG. 11B is a cross-sectional view taken along line A-A of FIG. 11A.
Figure 11C:
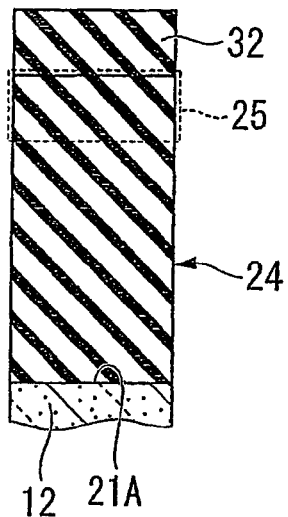
FIG. 11C is a cross-sectional view taken along line B-B of FIG. 11A.
Figure 11D:
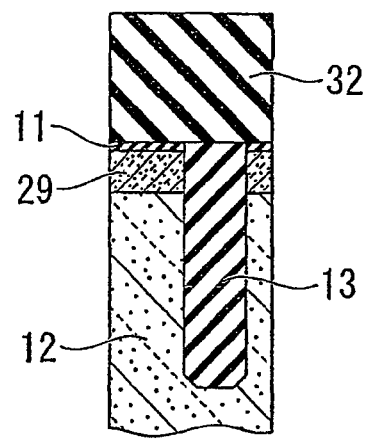
FIG. 11D is a cross-sectional view taken along line C-C of FIG. 11A.

The protective film 32 is formed of a film having a high etching selectivity to the second insulator film 35 (silicon oxide film ($SiO_2$ film)) and the substrate 12 (silicon (Si)) shown in FIG. 9B, which will be described later.

Specifically, a silicon nitride film (SiN film) is deposited by an LP-CVD method. Thus, a protective film 32 of the silicon nitride film (SiN film) is formed so that the projection portions 25 are covered in a conformal manner with the protective film 32.

Thus, the thickness $M_4$ of the protective film 32 formed on the sidewalls 25b and 25c of the projection portions 25 becomes equal to the thickness $M_3$ of the protective film 32 formed on the upper surfaces 25a of the projection portions 25.

Meanwhile, in a step illustrated with FIGS. 12A, 12B, 12C, and 12D, sidewall spacers (sidewall films) 42 are formed on the sidewalls 25b and 25c of the projection portions 25 by etching back the protective film 32. The sidewall spacers 42 serve as etching masks for forming the first trenches 45. The thickness $M_5$ of the sidewall spacers 42 is equal to the thickness $M_4$ of the protective film 32 shown in FIG. 8B.

Thus, the thickness $M_4$ of the protective film 32 is controlled so that sidewalls 45b of the first trenches 45 (see FIG. 13B) are located at desired positions based upon the sidewalls 25b and 25c of the projection portions 25. Therefore, the position of the sidewalls 45b of the first trenches 45 (i.e., the position at which the first trenches 45 are formed) can be defined in a self-aligned manner by the sidewall spacers 42 formed on the sidewalls 25b and 25c of the projection portions 25.

Figure 13A:
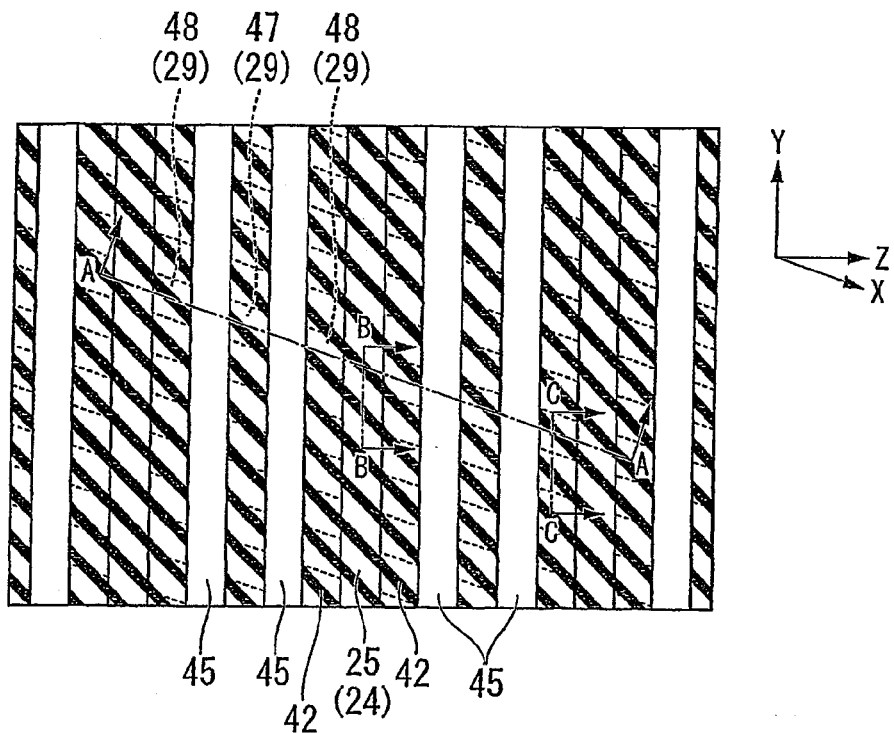
FIG. 13A is a plan view showing a step of manufacturing a semiconductor device following the step illustrated with FIG. 12A.

Thus, as described later with reference to FIGS. 13A and 13B, the positional precision is improved when the first trenches 45 are being processed. Therefore, variations in intervals between the separation trenches 21, in which the insulating isolation portions 24 are formed, and the first trenches 45 can be reduced on the plane of the substrate 12.

Furthermore, variations in area of upper surfaces 48a of the second impurity diffusion regions 48 formed between the first trenches 45 and the insulating isolation portions 24 are reduced. Therefore, it is possible to reduce variations in contact resistance between the second impurity diffusion regions 48 and contact plugs 68 that are in contact with the upper surfaces 48a of the second impurity diffusion regions 48 (see FIG. 14B). As a result, it is possible to reduce variations in characteristics of devices such as MIS transistors.

In a subsequent step illustrated with FIGS. 9A, 9B, 9C, and 9D, a second insulator film 35 is deposited so that a surface 32a of the protective film 32, including inner surfaces of the second trenches 33, is covered in a conformal manner with the second insulator film 35. Thus, third trenches 36 are formed in the second insulator film 35 at positions that are located above the second trenches 33.

At that time, the second insulator film 35 is formed by deposition of a film having a high etching selectivity to a coating insulator film 37 formed on the second insulator film 35.

Specifically, a silicon oxide film ($SiO_2$ film) is deposited by an LP-CVD method. Thus, a second insulator film 35 is formed with third trenches 36 defined therein. The third trenches 36 extend along the Y-direction. The width of the third trenches 36 is smaller than the width of the second trenches 33, which are located below the third trenches 36. Each of the third trenches 36 is formed at an intermediate position between two of the projection portions 25.

Then a coating insulator film 37 is formed on the surface 35a of the second insulator film 35 so that the third trenches 36 are filled with the coating insulator film 37. The coating insulator film 37 has a flat surface 37a. The coating insulator film 37 is formed of a film that can selectively be removed by etching in contrast to the second insulator film 35 (silicon oxide film ($SiO_2$ film)).

Specifically, a BARC film (antireflection film) is formed as the coating insulator film 37 by a coating method. In the following description, a BARC film is described as an example of the coating insulator film 37.

In a subsequent step illustrated with FIGS. 10A, 10B, 10C, and 10D, an unnecessary part of the coating insulator film 37 shown in FIGS. 9A, 9B, 9C, and 9D that has been formed at portions other than the third trenches 36 is selectively removed by etching-back with anisotropic etching. Thus, the coating insulator film 37 remains only within the third trenches 36.

Accordingly, surfaces 35a of the second insulator film 35 that are located between the third trenches 36 are exposed. Upper surfaces 37b of the coating insulator film 37 remaining within the third trenches 36 are flush with the surfaces 35a of the second insulator film 35 that are located between the third trenches 36.

In a subsequent step illustrated with FIGS. 11A, 11B, 11C, and 11D, the second insulator film 35 is etched back with anisotropic etching under such conditions that the second insulator film 35 is selectively etched until the surface 32a of the protective film 32 are exposed. Thus, the second insulator film 35 remains only below the coating insulator film 37.

Accordingly, part of the second trenches 33 is exposed, and a pattern having lines extending along the Y-direction is formed such that each of the lines is located at a central portion of the bottom of each of the second trenches 33. Each of the lines is formed of the second insulator film 35 and the coating insulator film 37 sequentially stacked.

In a subsequent step illustrated with FIGS. 12A, 12B, 12C, and 12D, the coating insulator film 37 remaining within the second trenches 33 is selectively removed.

Then the protective film 32 is removed by anisotropic dry etching with a mask of the second insulator film 35, which has a lined pattern, until the upper surface 11a of the silicon oxide film 11 is exposed.

Accordingly, sidewall spacers 42 and belt-like patterned portions 43 are formed in the same process step (a collective manner). The sidewall spacers 42 are formed of the sidewall spacer 32 so that the sidewalls 25b and 25c of the projection portions 25 are covered with the sidewall spacers 42. Each of the belt-like patterned portions 43 is formed of the protective film 32 located at the center of a space between the projection portions 25.

At that time, each of the sidewall spacers 42 is formed so as to cover the sidewall 25b or 25c of the projection portion 25 and part of the upper surface 11a of the silicon oxide film 11 that is located close to the sidewall 25b or 25c. Furthermore, the aforementioned anisotropic dry etching exposes the upper surfaces 25a of the projection portions 25.

The thickness $M_5$ of the sidewall spacers 42 formed on the sidewalls 25b and 25c of the projection portions 25 is equal to the thickness $M_4$ of the protective film 32 described above with reference to FIG. 8B.

The sidewall spacers 42 and the belt-like patterned portions 43 extend along the Y-direction so that they are opposed to each other at certain intervals. Opening trenches 39 are formed between the sidewall spacers 42 and the belt-like patterned portions 43. The opening trenches 39 extend along the Y-direction and expose the upper surfaces 29a of the impurity diffusion regions 29.

Figure 12A:
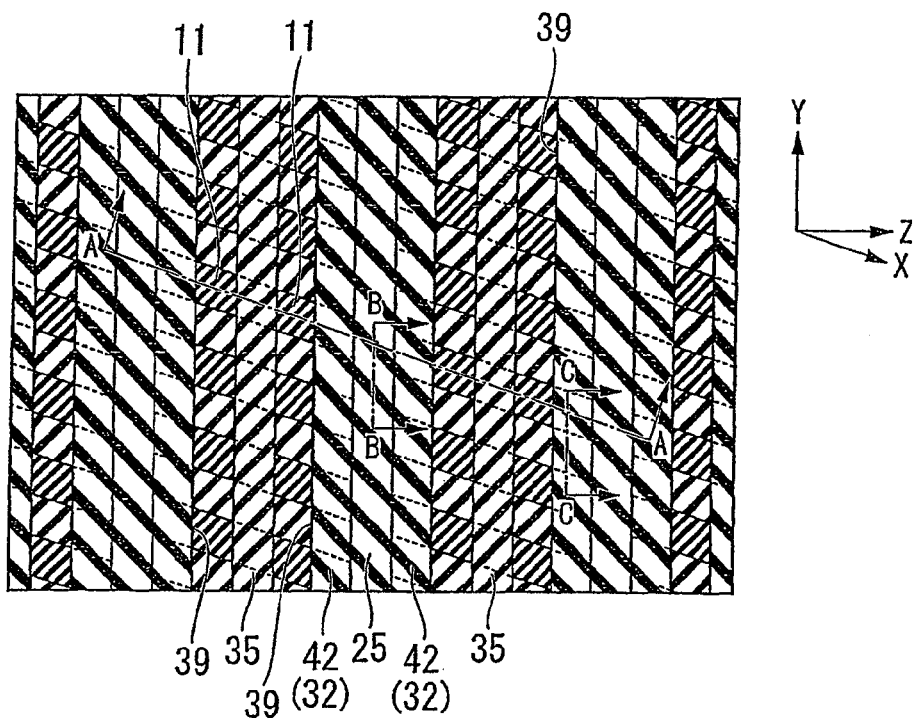
FIG. 12A is a plan view showing a step of manufacturing a semiconductor device following the step illustrated with FIG. 11A.
Figure 12B:
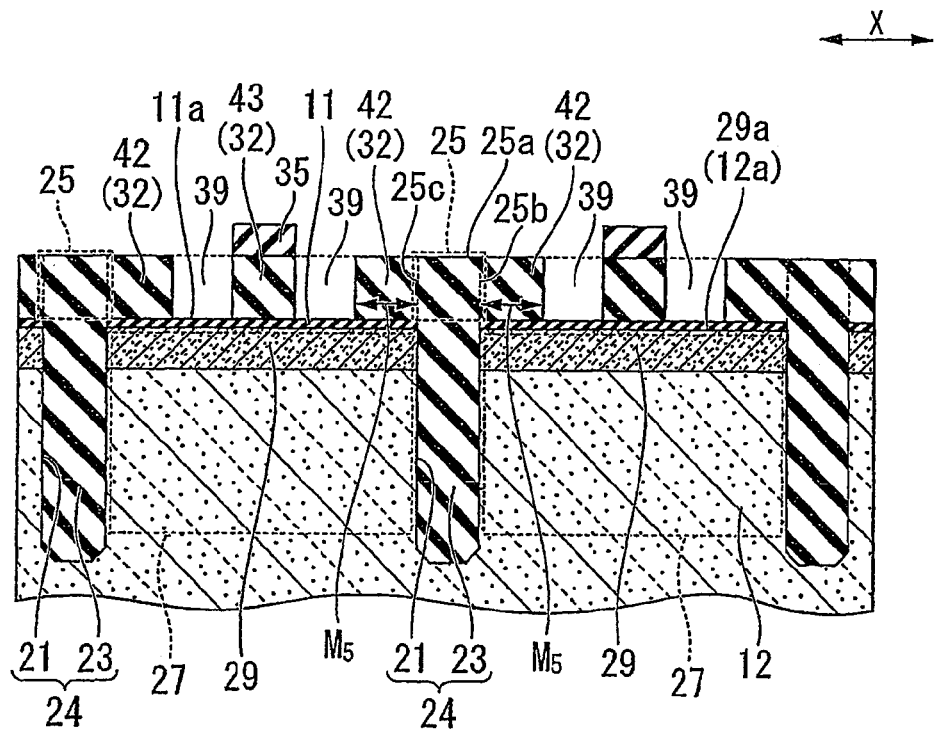
FIG. 12B is a cross-sectional view taken along line A-A of FIG. 12A.
Figure 12C:
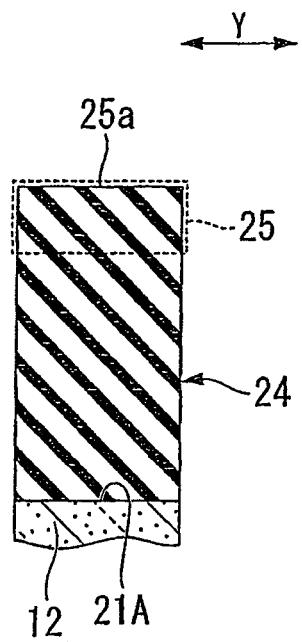
FIG. 12C is a cross-sectional view taken along line B-B of FIG. 12A.
Figure 12D:
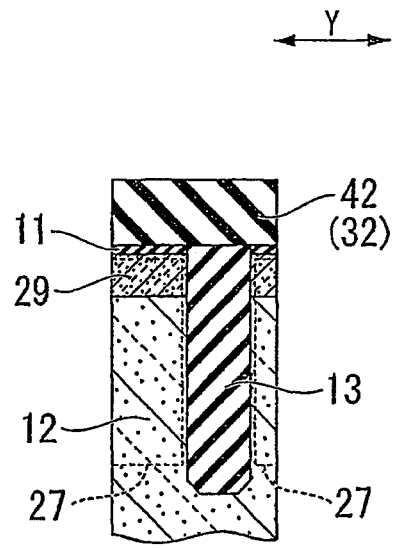
FIG. 12D is a cross-sectional view taken along line C-C of FIG. 12A.

The second insulator film 35 is slightly etched when the protective film 32 is removed by anisotropic dry etching. Nevertheless, the second insulator film 35 remains as shown in FIG. 12B upon completion of the etching.

Accordingly, the thickness of the belt-like patterned portions 43 does not decrease from the thickness of the sidewall spacers 42 and is still equal to the thickness of the sidewall spacers 42.

In a subsequent step illustrated with FIGS. 13A, 13B, 13C, and 13D, the second insulator film 35 remaining on the belt-like patterned portions 43 is removed.

Then part of silicon oxide film 11 and part of the principal surface 12a of the substrate 12 that are located below the opening trenches 39 are etched by anisotropic dry etching with an etching mask of the projection portions 25, the sidewall spacers 42, and the belt-like patterned portions 43. Thus, two first trenches 45 extending along the Y-direction are formed at portions of the substrate 12 between the two insulating isolation portions 24. Each of the first trenches 45 has a sidewall 45b located at a distance E from the sidewall 25b or 25c of the projection portion 25.

Figure 8A:
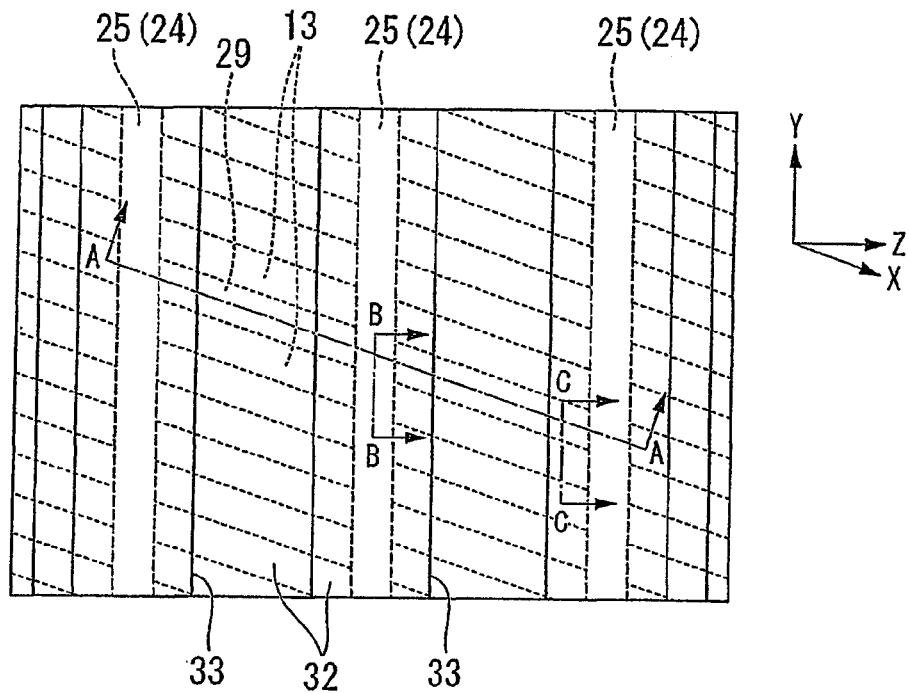
FIG. 8A is a plan view showing a step of manufacturing a semiconductor device following the step illustrated with FIG. 7A.
Figure 8B:
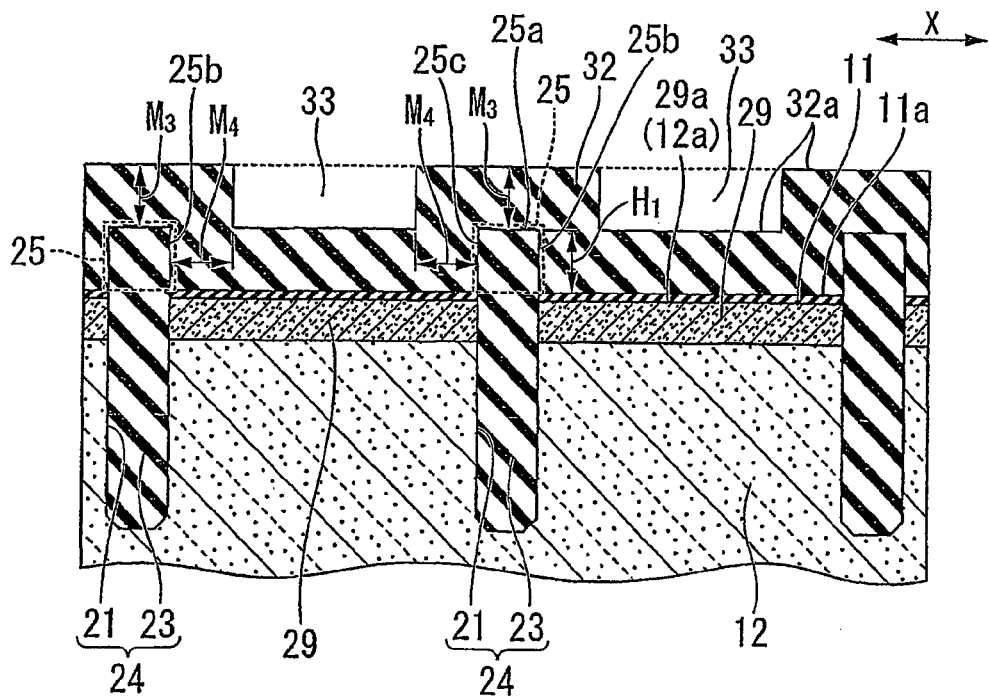
FIG. 8B is a cross-sectional view taken along line A-A of FIG. 8A.
Figure 8C:
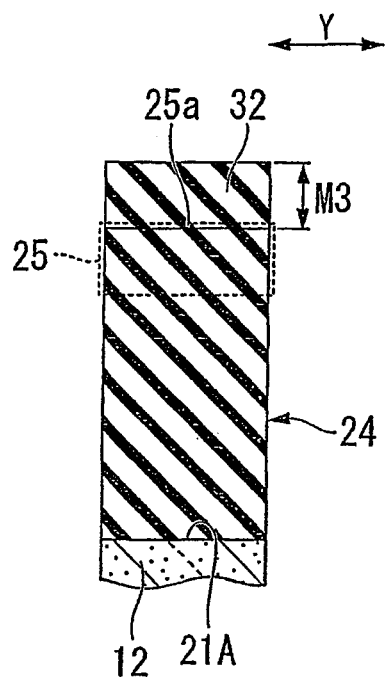
FIG. 8C is a cross-sectional view taken along line B-B of FIG. 8A.
Figure 8D:
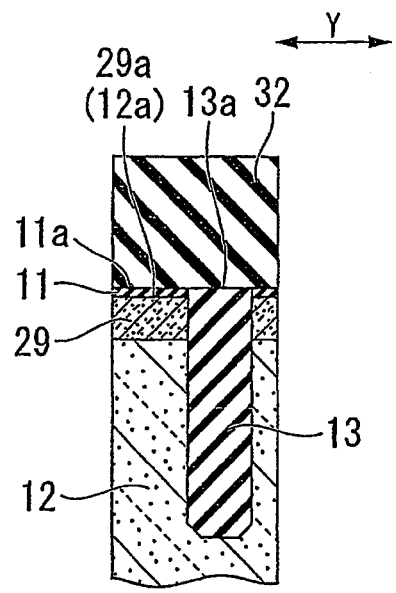
FIG. 8D is a cross-sectional view taken along line C-C of FIG. 8A.

In the first embodiment, the distance E is equal to the thickness $M_4$ of the protective film 32 formed on the sidewalls 25b and 25c of the projection portions 25 shown in FIG. 8B.

Figure 13B:
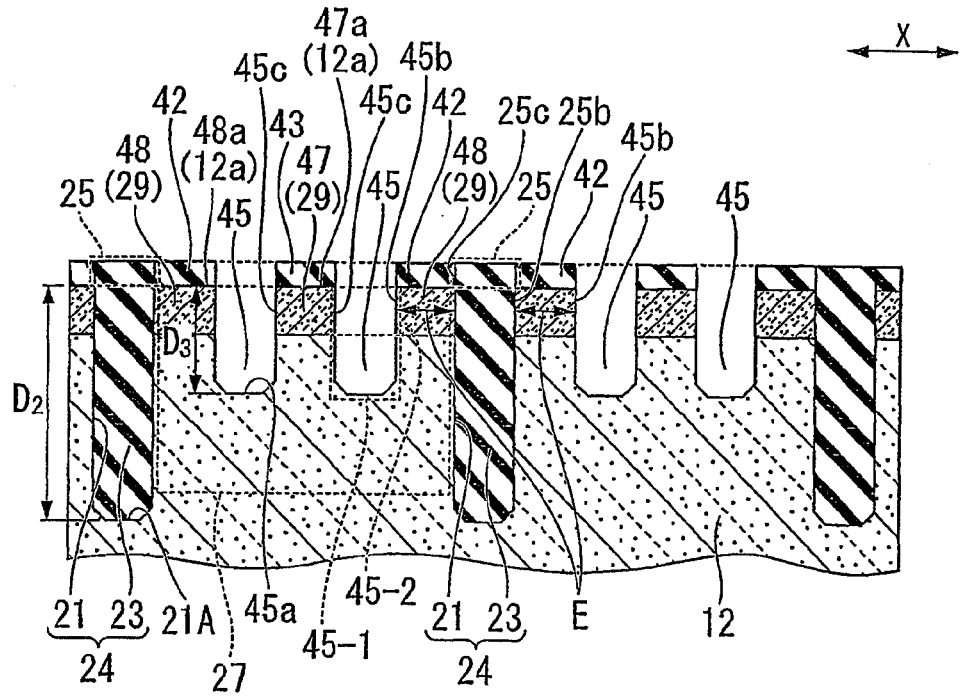
FIG. 13B is a cross-sectional view taken along line A-A of FIG. 13A.
Figure 13C:
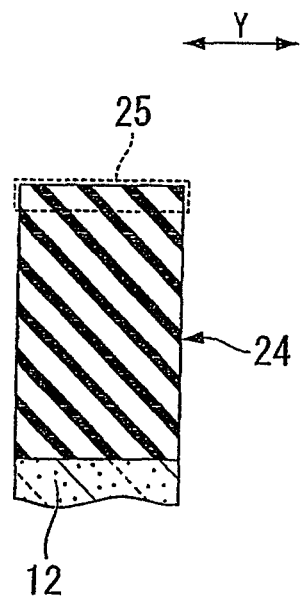
FIG. 13C is a cross-sectional view taken along line B-B of FIG. 13A.
Figure 13D:
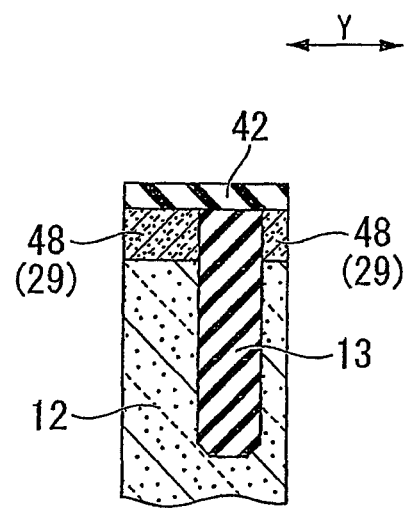
FIG. 13D is a cross-sectional view taken along line C-C of FIG. 13A.

At that time, as shown in FIGS. 13B, 13C, and 13D, the projection portions 25, the sidewall spacers 42, and the belt-like patterned portions 43, which are formed of a silicon nitride film (SiN film) and used as a mask, are slightly etched.

Accordingly, the thickness of the projection portions 25, the sidewall spacers 42, and the belt-like patterned portions 43 after the formation of the first trenches 45 is smaller than that of the projection portions 25, the sidewall spacers 42, and the belt-like patterned portions 43 prior to the formation of the first trenches 45.

The first trenches 45 are formed so as to have a depth $D_3$ smaller than the depth $D_2$ of the separation trenches 21 and the depth of the device isolation regions 13. The depth $D_3$ of the first trenches 45, the depth $D_2$ of the separation trenches 21, and the depth of the device isolation regions 13 are all defined as a depth measured from the principal surface 12a of the substrate 12.

The two first trenches 45 are formed across a plurality of active regions 27 that are arranged in the Y-direction and in which impurity diffusion regions 29 (see FIG. 12B) having a depth smaller than the first trenches 45 are formed. In other words, the two first trenches 45 divide each of the active regions 27 into three impurity diffusion regions 29.

Accordingly, a first impurity diffusion region 47 (first lightly doped drain (LDD) region) including the impurity diffusion region 29 is formed by a first sidewall 45c of each of the first trenches 45. A second impurity diffusion region 48 (second LLD region) including the impurity diffusion region 29 is formed by a second sidewall 45b of the first trench 45 (a sidewall opposed to the insulating isolation portion 24).

In other words, one first impurity diffusion region 47 disposed between two first trenches 45 and two second impurity diffusion regions 48 disposed between an insulating isolation portion 24 and a first trench 45 are formed in one active region 27.

Thus, the upper surfaces 47a and 48a of the first and second impurity diffusion regions 47 and 48 accord with the principal surface 12a of the substrate 12.

In a subsequent step illustrated with FIGS. 14A, 14B, 14C, and 14D, a gate insulator film 52 is formed by using a well-known technique so that lower portions 45-1 of the first trenches 45 (portions of the first trenches 45 that are located below the first and second impurity diffusion regions 47 and 48) are covered with the gate insulator film 52.

Then gate electrodes 53 are formed by using a well-known technique so that the lower portions 45-1 of the first trenches 45 are filled with the gate electrodes 53 via the gate insulator film 52.

Thus, there are generated two MIS transistors having a gate insulator film 52, a gate electrode 53, a first impurity diffusion region 47, and a second impurity diffusion region 48 in each of the active regions 27.

Then a buried insulator film 55 is formed by using a well-known technique so that upper portions 45-2 of the first trenches 45 (portions of the first trenches 45 that are located above the lower portions 45-1 of the first trenches 45) are embedded or buried with the buried insulator film 55. Upper surfaces 53a of the gate electrodes 53 are covered with the buried insulator film 55.

At that time, the buried insulator film 55 is formed so that an upper surface 55a of the buried insulator film 55 is flush with the upper surface 11a of the silicon oxide film 11. Specifically, a silicon nitride film (SiN film) is formed as the buried insulator film 55.

Furthermore, when the buried insulator film 55 is formed, the projection portions 25, the sidewall spacers 42, and the belt-like patterned portions 43 shown in FIG. 13B are removed so that the upper surface 11a of the silicon oxide film 11 is exposed.

Then a bit contact interlayer dielectric film 57 (silicon oxide film ($SiO_2$ film)) is formed on the upper surface 11a of the silicon oxide film 11, the upper surfaces 24a of the insulating isolation portions 24, the upper surfaces 13a of the device isolation regions 13, and the upper surface 55a of the buried insulator film 55. The bit contact interlayer dielectric film 57 has opening portions 57A for allowing part of the upper surfaces 47a of the first impurity diffusion regions 47 to be exposed.

Subsequently, bit lines 58 and cap insulator films 61 (silicon nitride film (SiN film)) are formed in the same process step. The bit lines 58 are arranged on the bit contact interlayer dielectric film 57 and filled in the opening portions 57A. The cap insulator films 61 are arranged on the bit lines 58. The bit lines 58 are embedded in the opening portions 57A and are thus brought into contact with the upper surfaces 47a of the first impurity diffusion regions 47.

Next, a liner film 62 (silicon nitride film (SiN film)) is formed by using a well-known technique so that the upper surfaces of the bit lines 58, the cap insulator films 61, and the bit contact interlayer dielectric film 57 are covered with the liner film 62. Then an interlayer dielectric film 64 (e.g., a coating insulator film (silicon oxide film)) for capacity contact is formed on the liner film 62 around the bit lines 58.

Subsequently, capacity contact holes 66 are formed by a well-known self-alignment contact (SAC) method so as to extend through the bit contact interlayer dielectric film 57. Those capacity contact holes 66 allow the upper surfaces 48a of the second impurity diffusion regions 48 to be exposed.

Thereafter, a conductive film (polysilicon film or metal film) is embedded in the capacity contact holes 66 by using a well-known technique to form capacity contact plugs 68. Each of the capacity contact plugs 68 has a lower end that is in contact with the upper surface 48a of the corresponding second impurity diffusion region 48.

Figure 14B:
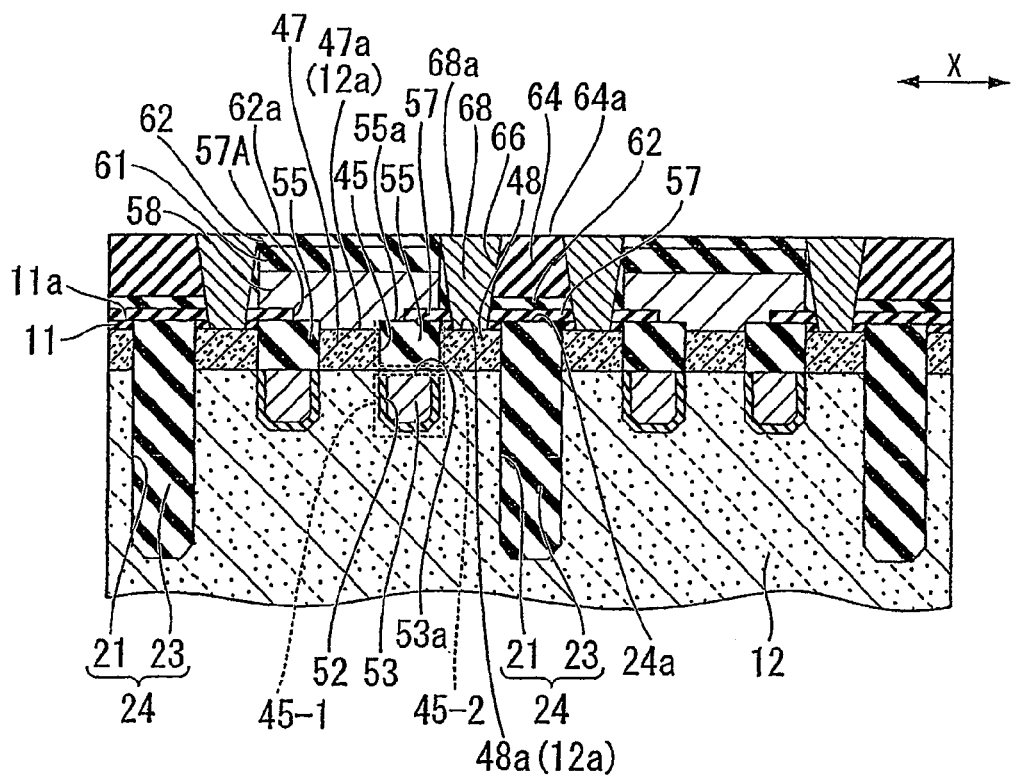
FIG. 14B is a cross-sectional view taken along line A-A of FIG. 14A.
Figure 14C:
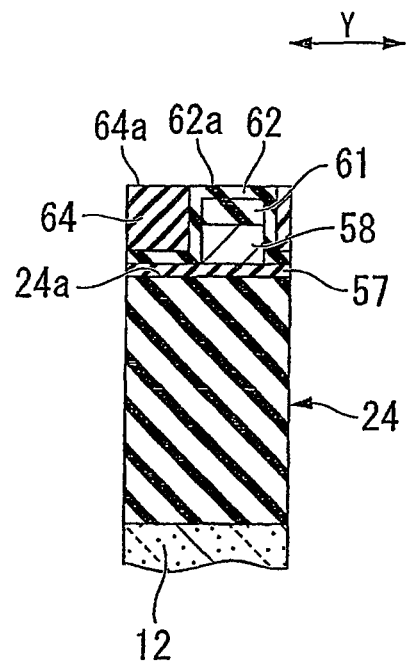
FIG. 14C is a cross-sectional view taken along line B-B of FIG. 14A.
Figure 14D:
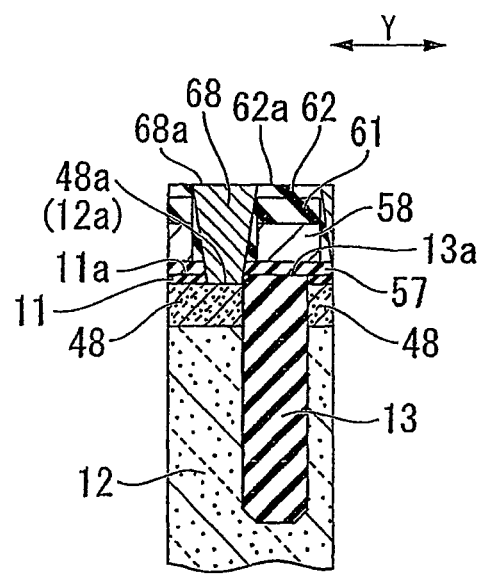
FIG. 14D is a cross-sectional view taken along line C-C of FIG. 14A.

Thus, a structure shown in FIGS. 14A, 14B, 14C, and 14D is constructed. At that time, an upper surface of the structure is flattened as shown in FIG. 14B.

In other words, an upper surface 62a of the liner film 62, an upper surface 64a of the interlayer dielectric film 64 for capacity contact, and upper surfaces 68a of the capacity contact plugs 68 are positioned on the same plane.

Figure 15A:
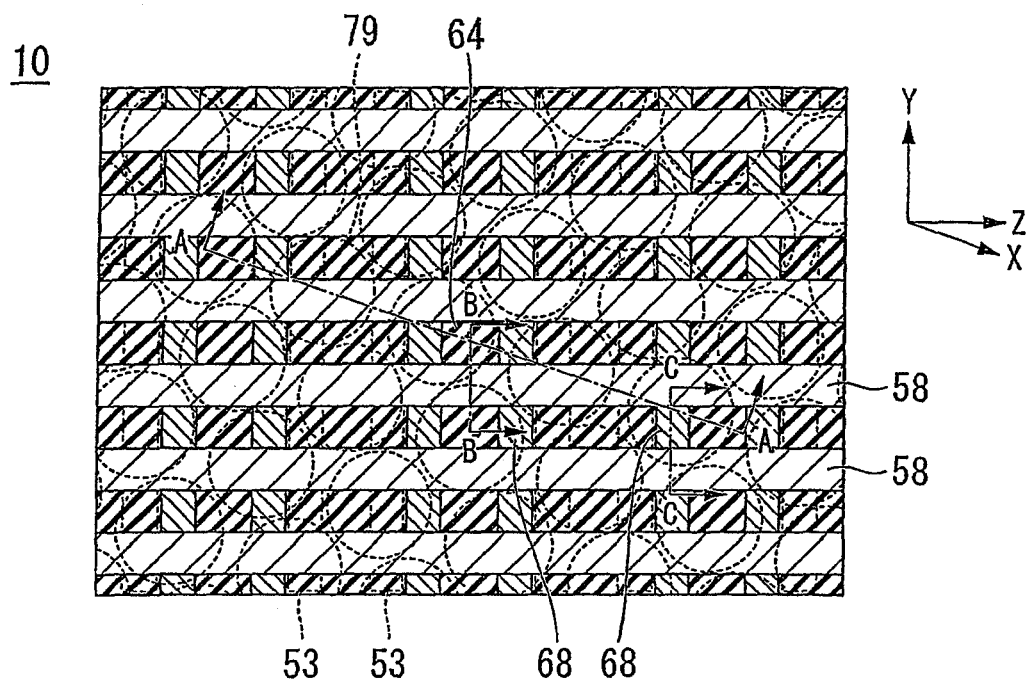
FIG. 15A is a plan view showing a step of manufacturing a semiconductor device following the step illustrated with FIG. 14A.
Figure 15B:
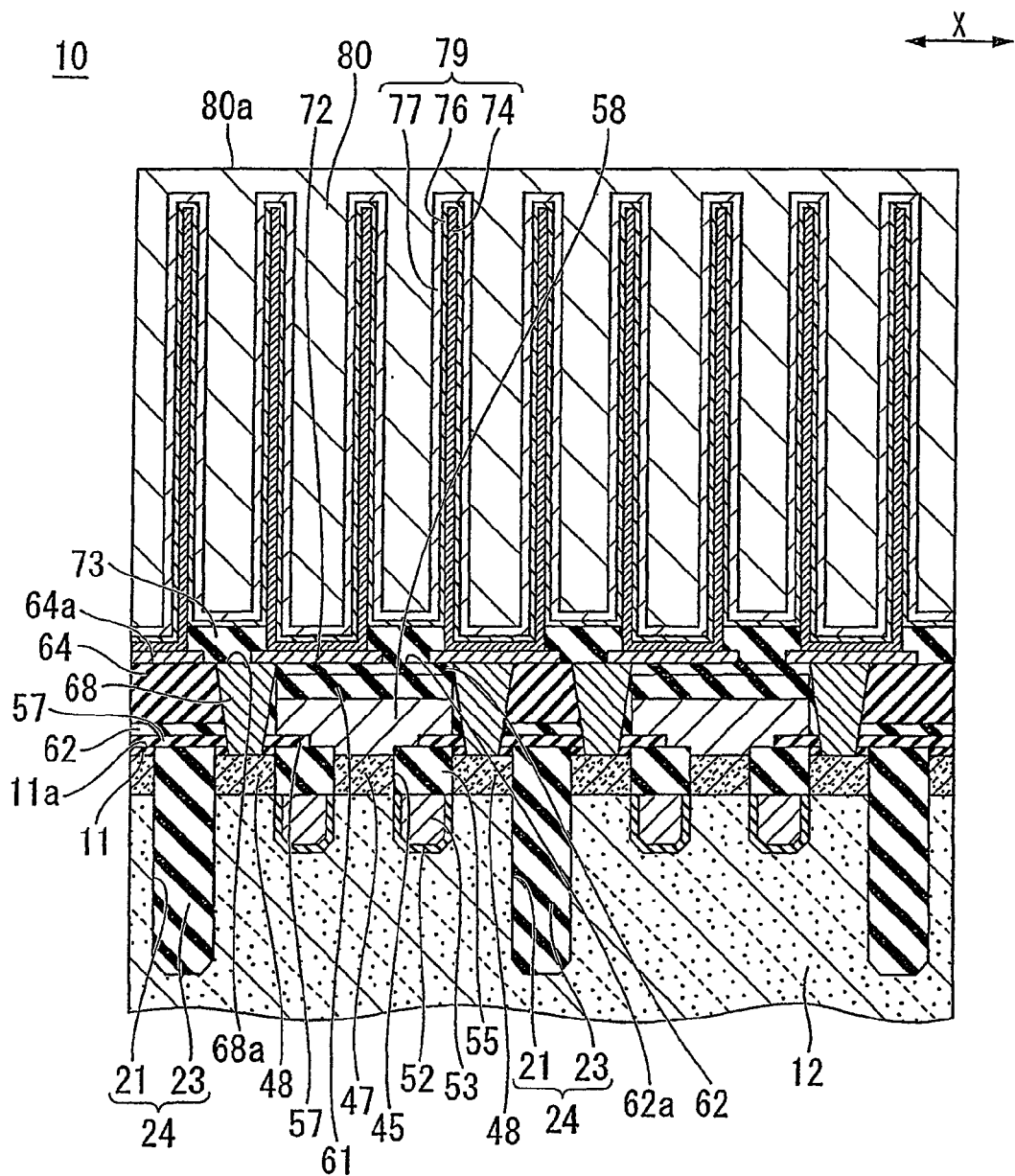
FIG. 15B is a cross-sectional view taken along line A-A of FIG. 15A.

The bit lines 58 are schematically illustrated in FIG. 14B and FIG. 15B, which will be referred to later, because it is difficult to show actual bit lines 58 that extend along a direction crossing a direction in which the gate electrodes 53 extend (Y-direction).

In a subsequent step illustrated with FIGS. 15A and 15B, capacity contact pads 72 and silicon nitride films 73 (SiN films) are sequentially formed by using a well-known technique. Each of the capacity contact pads 72 is in contact with at least part of the upper surface 68a of the corresponding capacity contact plug 68. A peripheral portion of each of the capacity contact pads 72 is covered with the silicon nitride film 73.

One capacity contact pad 72 is provided for each of the capacity contact plugs 68.

Next, lower electrodes 74 in the form of a crown, a capacity insulator film 76, and an upper electrode 77 are sequentially formed by using a well-known technique. Each of the lower electrodes 74 is disposed on an upper surface 72a of the corresponding capacity contact pad 72. The capacity insulator film 76 covers surfaces of the lower electrodes 74. The upper electrode 77 covers a surface of the capacity insulator film 76.

Thus, a capacitor (memory device) is formed by the lower electrode 74, the capacity insulator film 76, and the upper electrode 77.

Then a capacity plate 80 is formed so that insides of the lower electrodes 74 and gaps between adjacent lower electrodes 74 are filled with the capacity plate 80 via the upper electrode 77. Thus, a semiconductor device 10 according to the first embodiment is produced as shown in FIG. 15B.

At that time, one capacitor 79 is provided for each of the capacity contact pads 72. The capacity plate 80 has an upper surface 80a that is flat and is positioned above the upper electrode 77.

The semiconductor device 10 according to the first embodiment may have an interlayer dielectric film (not shown) formed on the upper surface 80a of the capacity plate 80, contact plugs that extend through such an interlayer dielectric film and are in contact with the upper electrode 77, wires disposed on the interlayer dielectric film and connected to upper ends of the contact plugs, and the like.

According to the first embodiment of a method of manufacturing a semiconductor device, the insulating isolation portions 24 are formed in a trench defined in the principal surface 12a of the substrate 12. Then the projection portions 25 are formed in which the upper portions 24A of the insulating isolation portions 24 project from the principal surface 12a of the substrate 12. Subsequently, the protective film 32 is formed so as to cover the projection portion 25 in a conformal manner. Thereafter, the protective film 32 is patterned so as to cover the sidewalls 25b and 25c of the projection portions 25 and part of the principal surface 12a of the substrate 12 that is located close to the sidewall 25b and 25c of the projection portions 25. Furthermore, sidewall spacers 42 of the protective film 32 are formed. Thus, the thickness $M_5$ (see FIG. 12B) of the sidewall spacers 42 formed on the sidewalls 25b and 25c of the projection portions 25 can be made equal to the thickness $M_4$ (see FIG. 8B) of the protective film 32.

In this manner, the thickness $M_4$ of the protective film 32 is controlled so that the sidewalls 45b of the first trenches 45 are located at desired positions based upon the sidewalls 25b and 25c of the projection portions 25. Therefore, the position of the sidewalls 45b of the first trenches 45 (i.e., the position at which the first trenches 45 are formed) can be defined in a self-aligned manner by the sidewall spacers 42 formed on the sidewalls 25b and 25c of the projection portions 25.

Accordingly, the positional precision is improved when the first trenches 45 are being processed. Therefore, variations in intervals between the separation trenches 21, in which the insulating isolation portions 24 are formed, and the first trenches 45 can be reduced on the plane of the substrate 12.

Furthermore, variations in area of the upper surfaces 48a of the second impurity diffusion regions 48 formed between the first trenches 45 and the insulating isolation portions 24 are reduced. Therefore, it is possible to reduce variations in contact resistance between the second impurity diffusion regions 48 and the contact plugs 68 that are in contact with the upper surfaces 48a of the second impurity diffusion regions 48. As a result, it is possible to reduce variations in characteristics of devices such as MIS transistors.

In the first embodiment, two first trenches 45 are formed in one active region 27. In other words, the second insulator film 35 and the coating insulator film 37 are deposited on the protective film 32 to form the sidewall spacers 42 and the belt-like patterned portions 43. Nevertheless, only one first trench 45 may be formed in one active region 27.

Figure 16:
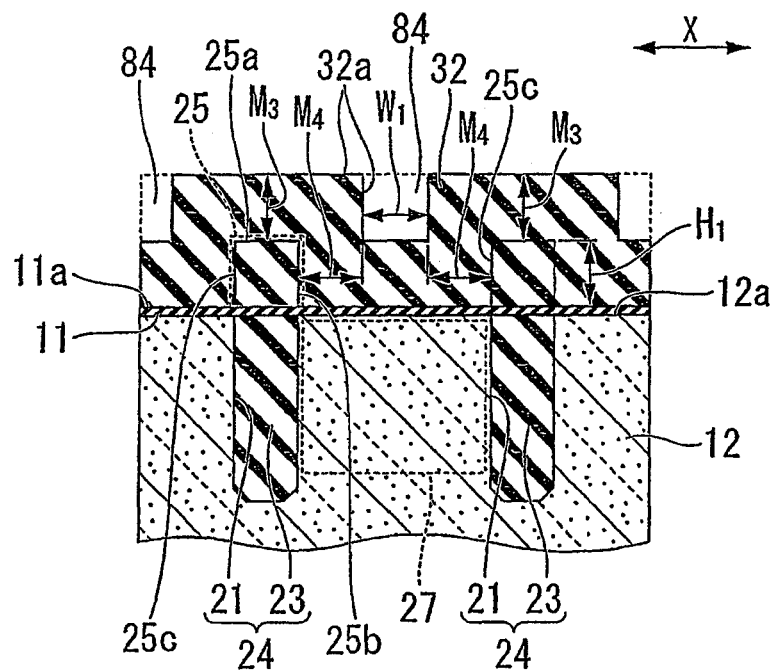
FIG. 16 is a cross-sectional view showing a step of manufacturing a semiconductor device according to a variation of the first embodiment of the present invention.
Figure 17:
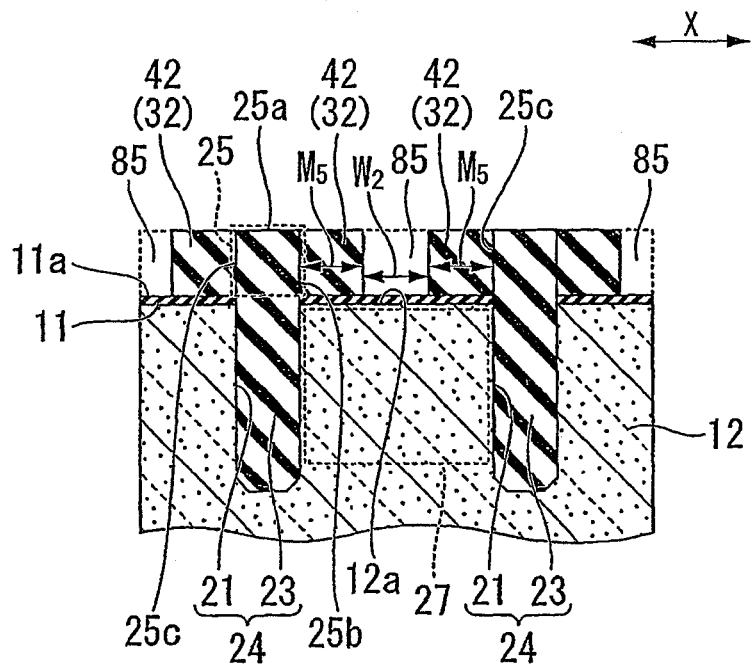
FIG. 17 is a cross-sectional view showing a step of manufacturing a semiconductor device following the step illustrated with FIG. 16.
Figure 18:
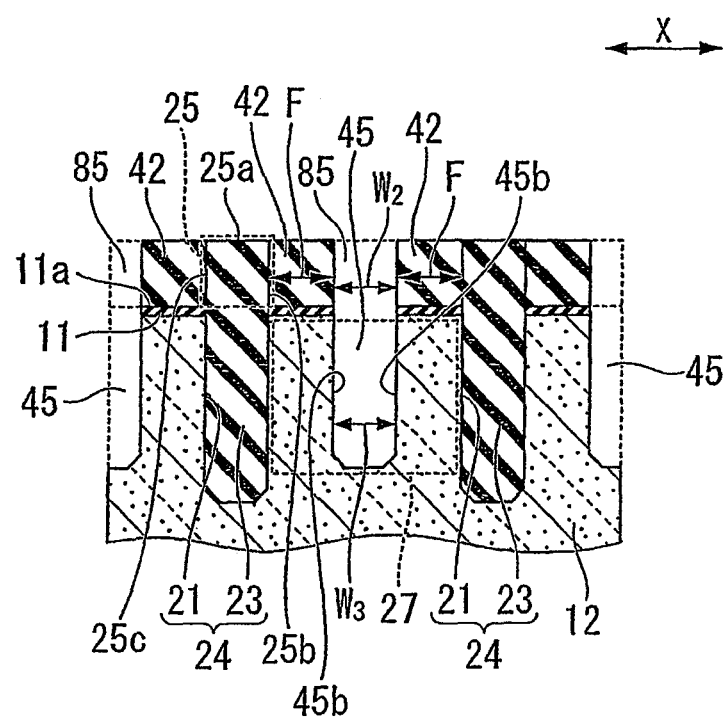
FIG. 18 is a cross-sectional view showing a step of manufacturing a semiconductor device following the step illustrated with FIG. 17.
Figure 19A:
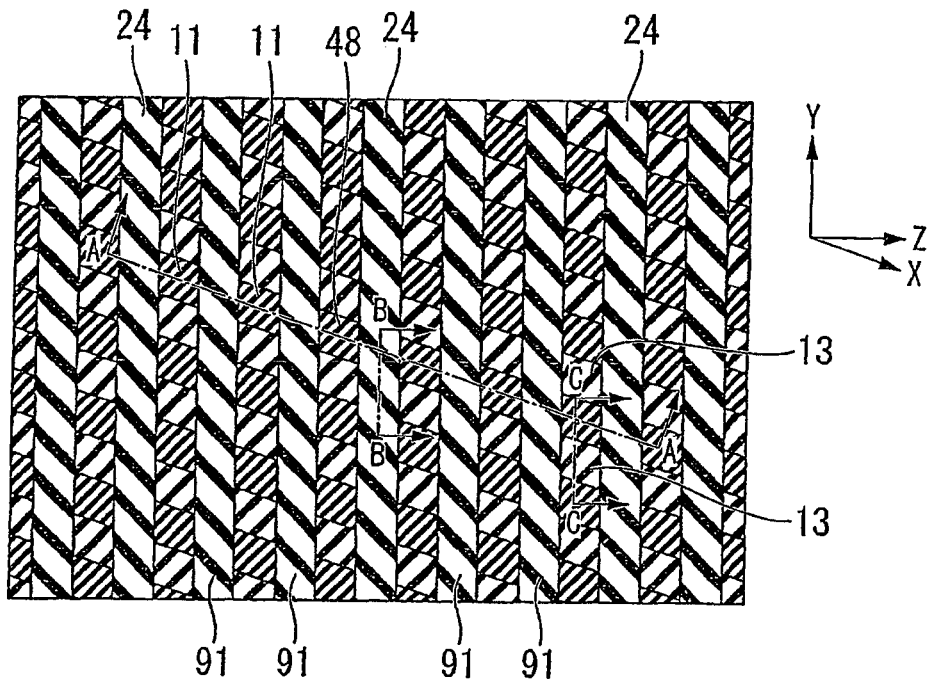
FIG. 19A is a plan view showing a step of manufacturing a semiconductor device according to a second embodiment of the present invention.
Figure 19B:
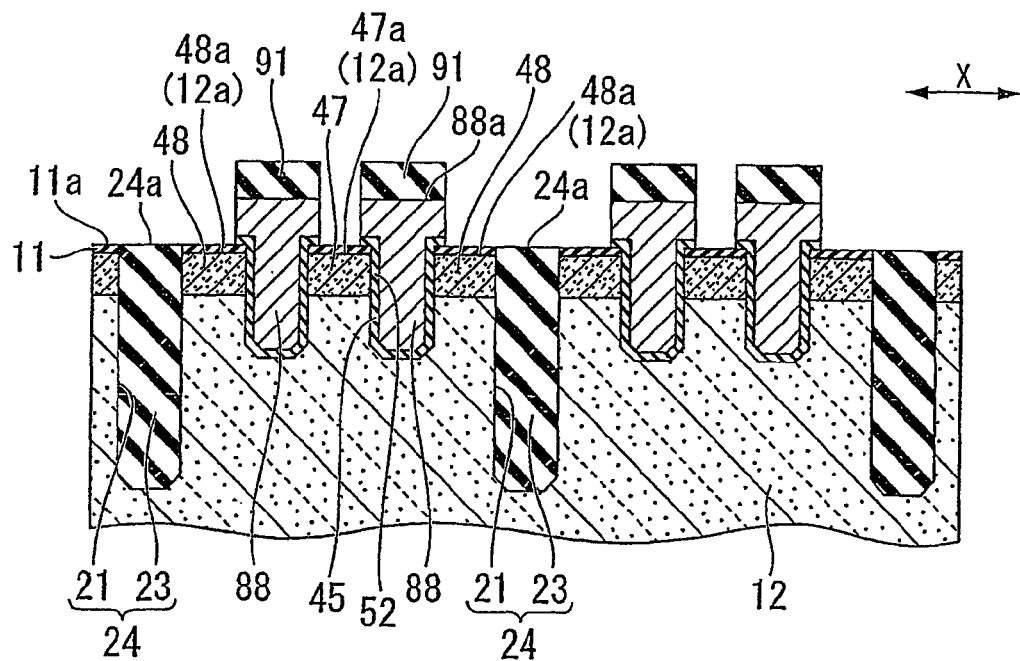
FIG. 19B is a cross-sectional view taken along line A-A of FIG. 19A.
Figure 19C:
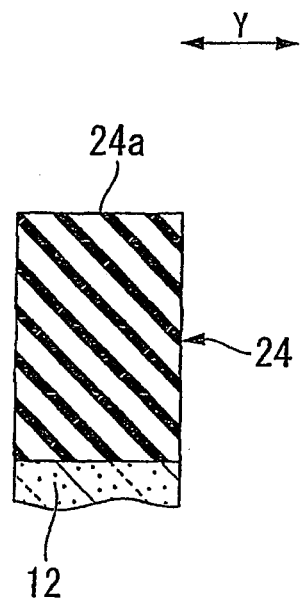
FIG. 19C is a cross-sectional view taken along line B-B of FIG. 19A.
Figure 19D:
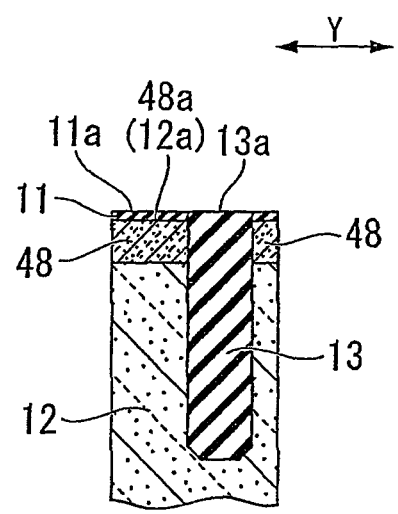
FIG. 19D is a cross-sectional view taken along line C-C of FIG. 19A.

FIGS. 16 to 18 are cross-sectional views showing a manufacturing process of a semiconductor device according to a variation of the first embodiment. In FIG. 16, the same components as shown in FIG. 8B are denoted by the same reference numerals. In FIG. 17, the same components as shown in FIG. 12B are denoted by the same reference numerals. In FIG. 18, the same components as shown in FIG. 13B are denoted by the same reference numerals.

A variation of the first embodiment of manufacturing a semiconductor will be described below with primary reference to FIGS. 16 to 18. In this variation, one first trench 45 is formed in one active region 27.

First, the aforementioned steps beginning from the step illustrated with FIGS. 1A, 1B, 1C, and 1D to the step illustrated with FIGS. 8A, 8B, 8C, and 8D are performed to thereby form insulating isolation portions 24 having projection portions 25 and a protective film 32, which covers the principal surface 12a of the substrate 12 and the projection portions 25 in a conformal manner. In this case, a trench portion 84 is formed on a surface 32a of the protective film 32 between two adjacent projection portions 25.

At that time, the thickness $M_4$ of the protective film 32 formed on the sidewalls 25b or 25c of the projection portions 25 is made equal to the distance F, as shown in FIG. 18, from the sidewalls 45b of the first trenches 45 to the sidewalls 25b or 25c of the projection portions 25.

Furthermore, the width W₁ of the trench portions 84 shown in FIG. 16 is equal to the width W₃ of the first trenches 45 formed by a step illustrated with FIG. 18. The thickness of the protective film 32 may be adjusted so that the width W₃ of the first trenches 45 has a desired value.

Next, in a step illustrated with FIG. 17, the protective film 32 shown in FIG. 16 is etched back until the upper surface 11*a* of the silicon oxide film 11 is exposed. Thus, sidewall spacers 42 of the protective film 32 and opening trenches 85 are formed in the same process step. The sidewall spacers 42 are formed on the sidewalls 25*b* and 25*c* of the projection portions 25, and each of the opening trenches 85 is formed between two sidewall spacers 42. The opening trenches 85 extend in the same direction as the projection portions 25 and allow the upper surface 11*a* of the silicon oxide film 11 to be exposed.

This etching-back process also allows upper surfaces 25*a* of the projection portions 25 to be exposed. The thickness M₅ of the sidewall spacers 42 formed on the sidewalls 25*b* and 25*c* of the projection portions 25 is equal to the thickness of the protective film 32 shown in FIG. 16. Furthermore, the width W₂ of the opening trenches 85 becomes equal to the width W₁ of the trench portions 84 shown in FIG. 16.

Then, in a step illustrated with FIG. 18, the silicon oxide film 11 and the substrate 12 that are located below the opening trenches 85 are etched by anisotropic dry etching with a mask of the projection portions 25 and the sidewall spacers 42, so that the first trenches 45 are formed. Each of the first trenches 45 has sidewalls 45*b* located at a distance F from a sidewall of each of the two insulating isolation portions 24 and extends along the same direction as the projection portions 25.

The distance F is equal to the thickness M₅ of the sidewall spacers 42 shown in FIG. 17, and the width W₃ of the first trenches 45 is equal to the width W₂ of the opening trenches 85.

With the aforementioned method of manufacturing a semiconductor device according to a variation of the first embodiment, there are formed insulating isolation portions 24 having projection portions 25 projecting from an upper surface 11*a* of a silicon oxide film 11. Then a protective film 32 is formed so as to cover the upper surface 11*a* of the silicon oxide film 11 and the projection portions 25 in a conformal manner. Subsequently, the protective film 32 is etched back to form sidewall spacers 42 on sidewalls 25*b* and 25*c* of the projection portions 25. Thereafter, anisotropic dry etching is conducted by using the projection portions 25 and the sidewall spacers 42 as a mask. Thus, the same advantages as attained with a method of manufacturing a semiconductor device according to the first embodiment can be attained when one first trench 45 is formed in an active region 27.

Specifically, positions of the sidewalls 45*b* of the first trenches 45 (i.e., locations at which the first trenches 45 are formed) can be defined in a self-aligned manner by the sidewall spacers 42 formed on the sidewalls 25*b* and 25*c* of the projection portions 25. Therefore, the positional precision is improved when the first trenches 45 are being processed. Therefore, variations in intervals between the separation trenches 21 and the first trenches 45 can be reduced on the plane of the substrate 12.

Accordingly, variations in area of the upper surfaces 48*a* of the second impurity diffusion regions 48 formed between the first trenches 45 and the insulating isolation portions 24 are reduced. Thus, it is possible to reduce variations in contact resistance between the second impurity diffusion regions 48 and the contact plugs 68 that are in contact with the upper surfaces 48*a* of the second impurity diffusion regions 48. As a result, it is possible to reduce variations in characteristics of devices such as MIS transistors.

Second Embodiment

FIGS. 19A to 19D and 20 are diagrams showing a process of manufacturing a semiconductor device according to a second embodiment of the present invention.

Figure 20:
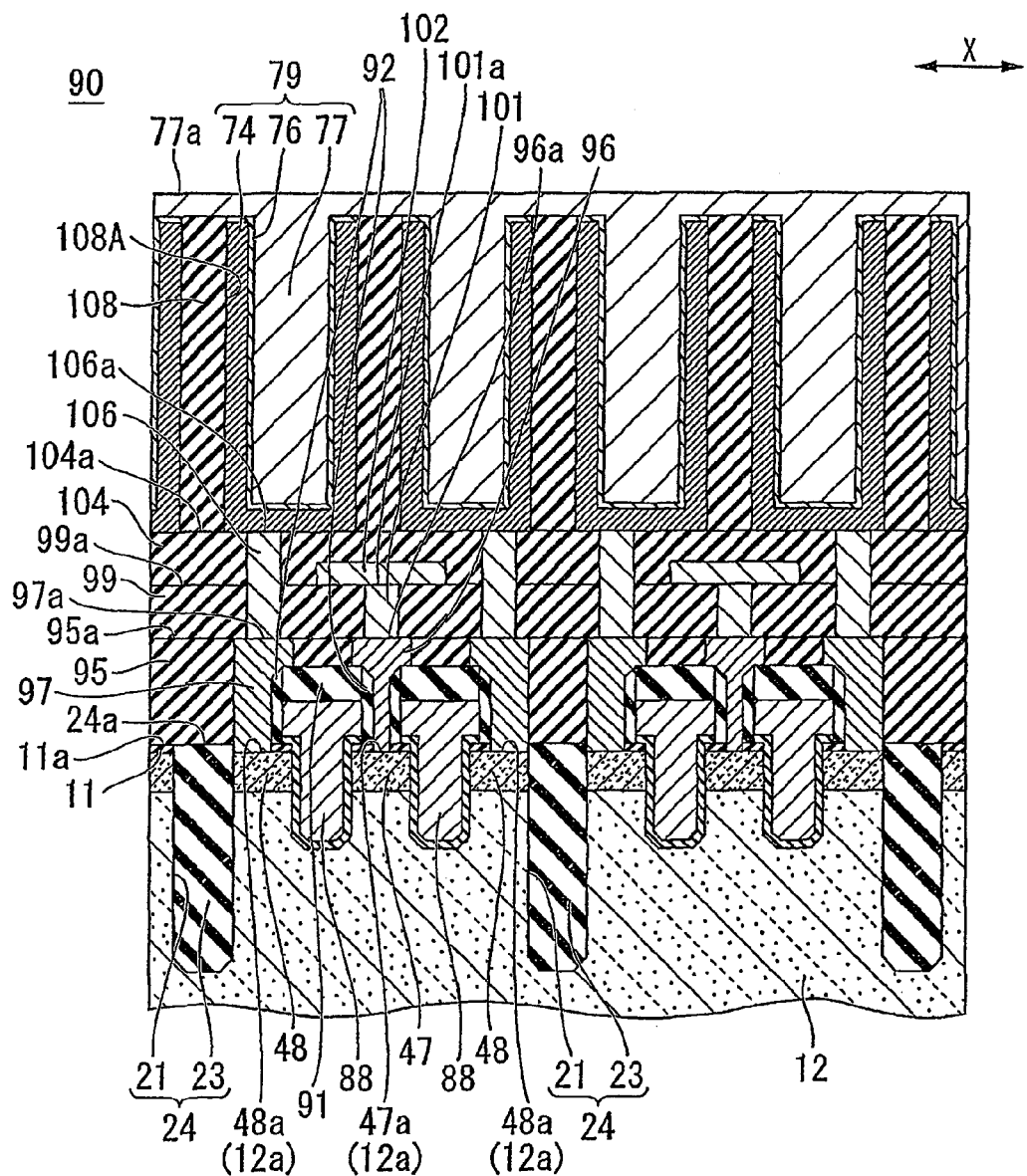
FIG. 20 is a cross-sectional view showing a step of manufacturing a semiconductor device following the step illustrated with FIG. 19B.

In FIGS. 19A to 19D, the same components as in the structure of the first embodiment shown in FIGS. 14A to 14D are denoted by the same reference numerals. In FIG. 20, the same components as in the semiconductor device 10 of the first embodiment shown in FIG. 15B are denoted by the same reference numerals.

Bit lines 102 are schematically illustrated in FIG. 20 because it is difficult to show actual bit lines 102 that extend along a direction crossing a direction in which gate electrodes 88 extend (Y-direction).

A method of manufacturing a semiconductor device 90 according to a second embodiment of the present invention will be described with primary reference to FIGS. 19A to 19D and 20.

First, the aforementioned steps of the first embodiment beginning from the step illustrated with FIGS. 1A, 1B, 1C, and 1D to the step illustrated with FIGS. 13A, 13B, 13C, and 13D are performed to thereby form a structure shown in FIGS. 13A, 13B, 13C, and 13D.

Then the projection portions 25 and the sidewall spacers 42 are removed by using a well-known technique so that the upper surface 11*a* of the silicon oxide film 11 is exposed.

In a subsequent step illustrated with FIGS. 19A, 19B, 19C, and 19D, a gate insulator film 52 is formed by using a well-known technique so that the overall inner surfaces of the first trenches 45 are covered with the gate insulator film 52.

Next, gate electrodes 88 and a cap insulator film 91 (silicon nitride film (SiN film)) are formed in the same process step by using a well-known technique. The first trenches 45 are filled with the gate electrodes 88 via the gate insulator film 52. Each of the gate electrodes 88 projects from the upper surface 11*a* of the silicon oxide film 11 and has an upper surface 88*a* covered with the cap insulator film 91.

Subsequently, in a step illustrated with FIG. 20, spacers 92 are formed by using a well-known technique so that sidewalls of portions of the gate electrodes 88 that project from the upper surface 11*a* of the silicon oxide film 11 are covered with the spacers 92. At that time, a silicon nitride film (SiN film) is used as a base material for the spacers 92.

Then a first interlayer dielectric film 95 (interlayer dielectric) is formed on the upper surfaces 24*a* of the insulating isolation portions 24 and the upper surface 11*a* of the silicon oxide film 11 by using a well-known technique. The cap insulator film 91, the spacers 92, and the gate electrodes 88 are covered with the first interlayer dielectric film 95.

For example, the first interlayer dielectric film 95 is formed by deposition of a silicon oxide film (SiO₂ film).

Next, first contact plugs 96 and second contact plugs 97 are formed in the same process step by using a well-known technique. Each of the first contact plugs 96 extends through the first interlayer dielectric film 95 and the silicon oxide film 11 and is in contact with the upper surface 47*a* of the corresponding first impurity diffusion region 47. Each of the second contact plugs 97 extends through the first interlayer dielectric film 95 and the silicon oxide film 11 and is in contact with the upper surface 48*a* of the corresponding second impurity diffusion region 48.

At that time, the first and second contact plugs 96 and 97 have upper surfaces 96a and 97a that are flush with a flat upper surface 95a of the first interlayer dielectric film 95.

Subsequently, a second interlayer dielectric film 99 (e.g., a silicon oxide film (SiO$_2$ film)) is formed on the upper surface 95a of the first interlayer dielectric film 95, the upper surfaces 96a of the first contact plugs 96, and the upper surfaces 97a of the second contact plugs 97 by using a well-known technique.

Then, bit contacts 101 are formed by using a well-known technique. Each of the bit contacts 101 extends through the second interlayer dielectric film 99 and is contact with the upper surface 96a of the corresponding first contact plug 96. At that time, the bit contacts 101 are formed such that upper surfaces 101a of the bit contacts 101 are flush with a flat upper surface 99a of the second interlayer dielectric film 99.

Next, bit lines 102 are formed on the upper surface 99a of the second interlayer dielectric film 99 by using a well-known technique. Each of the bit lines 102 is in contact with the upper surface 101a of the corresponding bit contact 101 and extends along a direction crossing a direction in which the gate electrodes 88 extend.

Thus, each of the bit lines 102 is electrically connected to the corresponding first impurity diffusion region 47 (a region common to two adjacent MIS transistors) via the bit contact 101.

Subsequently, a third interlayer dielectric film 104 (e.g., a silicon oxide film (SiO$_2$ film)) and third contact plugs 106 are sequentially formed by using a well-known technique. The third interlayer dielectric film 104 is disposed on the upper surface 99a of the second interlayer dielectric film 99 so that the bit lines 102 are covered with the third interlayer dielectric film 104. Each of the third contact plugs 106 extends through the second and third interlayer dielectric films 99 and 104 and has a lower end that is in contact with the upper surface 97a of the corresponding second contact plug 97.

At that time, upper surfaces 106a of the third contact plugs 106 are flush with a flat upper surface 104a of the third interlayer dielectric film 104.

Then an interlayer dielectric film 108 (e.g., a silicon oxide film (SiO$_2$ film)) for capacitor formation is formed on the upper surface 104a of the third interlayer dielectric film 104 by using a well-known technique such that the interlayer dielectric film 108 has cylindrical holes 108A defined therein for allowing the upper surfaces 106a of the third contact plugs 106 to be exposed.

Next, lower electrodes 74 in the form of a crown, a capacity insulator film 76, and an upper electrode 77 are sequentially formed by using a well-known technique. Each of the lower electrodes 74 covers an inner surface of the corresponding cylindrical hole 108A. The capacity insulator film 76 covers surfaces of the lower electrodes 74 exposed from the interlayer dielectric film 108 for capacitor formation. The insides of the lower electrodes 74 are filled with the upper electrode 77 via the capacity insulator film 76. The upper electrode 77 has a flat upper surface 77a.

Thus, a capacitor 79 (memory device) including the lower electrode 74, the capacity insulator film 76, and the upper electrode 77 is formed, and a semiconductor device 90 according to the second embodiment is produced.

Each of the lower electrodes 74 covers the inner surface of the corresponding cylindrical hole 108A, so that it is brought into contact with the upper surface 106a of the corresponding third contact plug 106. As a result, the lower electrode 74 is electrically connected to the corresponding second impurity diffusion region 48 via the upper surface 106a of the third contact plug 106.

The semiconductor device 90 according to the second embodiment may be produced in such a following manner. After formation of the capacitors 79, an interlayer dielectric film (not shown) are formed on the upper surface 77a of the upper electrode 77. Contact plugs are formed so that they extend through such an interlayer dielectric film and are in contact with the upper electrode 77. Further, wires are formed on the interlayer dielectric film and connected to upper ends of those contact plugs.

According to the second embodiment of a method of manufacturing a semiconductor device, the first trenches 45 are formed in the principal surface 12a of the substrate 12 with a mask of the sidewall spacers 42. Thus, the positional precision of the first trenches 45 is improved when the first trenches 45 are being processed. Therefore, variations in intervals between the separation trenches 21, in which the insulating isolation portions 24 are formed, and the first trenches 45 can be reduced on the plane of the substrate 12.

Accordingly, variations in area of the upper surfaces 48a of the second impurity diffusion regions 48 formed between the first trenches 45 and the insulating isolation portions 24 are reduced on the plane of the substrate 12. Furthermore, variations in area of the upper surfaces 47a of the first impurity diffusion regions 47 formed between the first trenches 45 are also reduced.

Therefore, it is possible to reduce variations in contact resistance between the second impurity diffusion regions 48 and the second contact plugs 97 that are in contact with the upper surfaces 48a of the second impurity diffusion regions 48 and variation in contact resistance between the first impurity diffusion regions 47 and the first contact plugs 96 that are in contact with the upper surfaces 47a of the first impurity diffusion regions 47. As a result, it is possible to reduce variation in characteristics of devices such as MIS transistors.

The present invention has been described along with some embodiments. Nevertheless, the present invention is not limited to those embodiments. It should be understood that various modifications and changes may be made therein without departing from the scope of the present invention defined by the claims.

In the aforementioned method of manufacturing a semiconductor device 10 or 90 according to the first or second embodiment, a silicon oxide film 11 is formed as an etching stopper film on an upper surface 12a of a substrate 12, and a sacrifice film 15 is formed on an upper surface 11a of the silicon oxide film 11. However, depending upon the type of the sacrifice film 15, it is not necessary to form the etching stopper film (silicon oxide film 11). In such a case, the sacrifice film 15 may be formed directly on the upper surface 12a of the substrate 12.

The etching stopper film is not limited to a silicon oxide film.

Some or all of the above embodiments can be described as in the following notes. Nevertheless, the present invention is not limited to those notes.

(Note 1)

A method of manufacturing a semiconductor device, the method comprising:

forming an insulating isolation portion in a trench defined in a principal surface of a substrate;

forming a projection portion in which an upper portion of the insulating isolation portion projects from the principal surface of the substrate;

forming a sidewall film covering a sidewall of the projection portion and part of the principal surface of the substrate that is located close to the sidewall of the projection portion; and forming a first trench in the substrate by etching the principal surface of the substrate using the sidewall film as a mask.

(Note 2)

A method of manufacturing a semiconductor device, the method comprising:

forming insulating isolation portions in trenches defined in a principal surface of a substrate;

forming at least a pair of projection portions in which upper portions of the insulating isolation portions project from the principal surface of the substrate;

forming sidewall films covering sidewalls of the projection portions and part of the principal surface of the substrate that is located close to the sidewalls of the projection portions; and forming a first trench in the substrate by etching the principal surface of the substrate using the sidewall films as a mask, the forming of the sidewall films including forming an opening trench for allowing the principal surface of the substrate to be exposed between the sidewall films of the at least the pair of projection portions opposed to each other.

(Note 3)

A method of manufacturing a semiconductor device, the method comprising:

forming insulating isolation portions in trenches defined in a principal surface of a substrate;

forming at least a pair of projection portions in which upper portions of the insulating isolation portions project from the principal surface of the substrate;

forming, in the same process step, sidewall films covering sidewalls of the projection portions and part of the principal surface of the substrate that is located close to the sidewalls of the projection portions, a belt-like patterned portion arranged between the sidewall films of the at least the pair of projection portions opposed to each other, and an opening trench arranged between the belt-like patterned portion and the sidewall films for allowing the principal surface of the substrate to be exposed; and forming a first trench in the substrate by etching the principal surface of the substrate using sidewall films and the belt-like patterned portion as a mask.

(Note 4)

The method as recited in Note 2 or 3, wherein the forming of the insulating isolation portions includes:

forming a sacrifice film on the principal surface of the substrate, forming separation trenches extending through the sacrifice film and partway digging part of the substrate that is located below the sacrifice film, and filling the separation trenches with a first insulator film from a bottom of each of the separation trenches to a height that is equal to or higher than the principal surface of the substrate and is equal to or lower than a surface of the sacrifice film, thereby forming the insulating isolation portions of the first insulator film, and the forming of the at least the pair of projection portions includes removing the sacrifice film to form the at least the pair of projection portions in which the upper portions of the insulating isolation portions that have been covered with the sacrifice film project from the principal surface of the substrate.

(Note 5)

The method as recited in Note 2 or 4, wherein the forming of the sidewall films includes:

forming a protective film so that the at least the pair of projection portions are covered in a conformal manner with the protective film, and etching back the protective film for thereby forming the sidewall films of the protective film that cover the sidewalls of the projection portions and the part of the principal surface of the substrate that is located close to the sidewalls of the projection portions.

(Note 6)

The method as recited in Note 5, wherein the forming of the protective film includes depositing the protective film covering the principal surface of the substrate and the projection portions in a conformal manner for thereby forming second trenches in the protective film between the at least the pair of projection portions, the method further comprises:

depositing a second insulator film covering a surface of the protective film including inner surfaces of the second trenches in a conformal manner, for thereby forming third trenches in the second insulator film at positions that are located above the second trenches;

forming a coating insulator film on a surface of the second insulator film so that the third trenches are filled with the coating insulator film, for thereby providing a flat surface of the coating insulator film;

selectively etching back the coating insulator film, for thereby allowing the coating insulator film to remain within the third trenches and allowing a surface of the second insulator film located between the third trenches to be exposed;

selectively etching the second insulator film with a mask of the coating insulator film remaining within the third trenches, for thereby allowing the second insulator film to remain only below the coating insulator film; and removing a remainder of the coating insulator film, the forming of the sidewall films includes removing the protective film by etching with a mask of a remainder of the second insulator film until the principal surface of the substrate is exposed, for thereby forming the sidewall films and a belt-like patterned portion of the protective film arranged at center of a space between the at least the pair of projection portions in the same process step, and the forming of the first trench includes etching the principal surface of the substrate with an etching mask of the projection portions, the sidewall films, and the belt-like patterned portion, for thereby forming two first trenches in the substrate that are located between the insulating isolation portions.

(Note 7)

The method as recited in any one of Notes 4 to 6, wherein the forming of the insulating isolation portions includes forming the insulating isolation portions so that an upper surface of the first insulator film filled in the separation trench is flush with the surface of the sacrifice film, and the forming of the sacrifice film includes controlling a thickness of the sacrifice film so that the projection portions have a desired height.

(Note 8)

The method as recited in Note 7, wherein the forming of the at least the pair of projection portions includes forming the projection portions so that a height of the projection portions is greater than a thickness of the protective film, and the forming of the protective film includes controlling a thickness of the protective film so that a sidewall of the first trench is located at a desired position from the sidewalls of the projection portions.

(Note 9)

The method as recited in any one of Notes 4 to 8, wherein the forming of the first trench includes forming the first trench so that a depth of the first trench is smaller than a depth of the separation trench.

(Note 10)

The method as recited in any one of Notes 4 to 9, further comprising forming an etching stopper film on the principal surface of the substrate before the forming of the sacrifice film, the etching stopper film protecting the substrate from an etching liquid used to remove the sacrifice film, wherein the forming of the sacrifice film includes forming the sacrifice film on an upper surface of the etching stopper film.

(Note 11)

The method as recited in Note 10, further comprising using silicon as a material for the substrate, wherein the forming of the sacrifice film includes depositing a doped polysilicon film to form the sacrifice film, and the removing of the sacrifice film includes using ammonia water as the etching liquid.

(Note 12)

The method as recited in any one of Notes 4 to 11, further comprising forming device isolation regions on the principal surface of the substrate before the forming of the insulating isolation portions, the device isolation regions extending along a direction crossing the insulating isolation portions and defining an active region along with the insulating isolation portions, wherein the first insulator film is formed of a film having a high etching selectivity to the device isolation regions and the active region.

(Note 13)

The method as recited in any one of Notes 6 to 11, wherein the protective film is formed of a film having a high etching selectivity to the second insulator film and the substrate.

(Note 14)

The method as recited in any one of Notes 6 to 13, wherein the second insulator film is formed of a film having a high etching selectivity to the coating insulator film.

(Note 15)

The method as recited in any one of Notes 12 to 14, further comprising forming an impurity diffusion region in the active region after the removing of the sacrifice film, wherein the forming of the first trench includes dividing the impurity diffusion region into a first impurity diffusion region on a first sidewall of the first trench and a second impurity diffusion region on a second sidewall of the first trench.

(Note 16)

The method as recited in Note 15, further comprising:

forming a gate insulator film covering a lower inside surface of the first trench; and forming a gate electrode filling a lower portion of the first trench via the gate insulator film.

(Note 17)

The method as recited in Note 16, further comprising forming a buried insulator film filling an upper portion of the first trench and covering an upper surface of the gate electrode.

(Note 18)

The method as recited in any one of Notes 15 to 17, further comprising:

forming a bit contact in contact with an upper surface of the first impurity diffusion region and a bit line incorporated with the bit contact;

forming an interlayer dielectric film for capacity contact that covers the bit line; and forming a capacity contact plug extending through the interlayer dielectric film for capacity contact, the capacity contact plug being in contact with an upper surface of the second impurity diffusion region.

(Note 19)

The method as recited in any one of Notes 15 to 18, further comprising:

forming a gate insulator film covering an inside surface of the first trench; and forming a gate electrode filling the first trench via the gate insulator film and projecting from the principal surface of the substrate.

(Note 20)

The method as recited in Note 19, further comprising:

forming, on the principal surface of the substrate, an interlayer dielectric film covering part of the gate electrode that projects from the principal surface; and forming, in the same process step, a first contact plug extending through the interlayer dielectric film so that the first contact plug is in contact with an upper surface of the first impurity diffusion region and a second contact plug extending through the interlayer dielectric film so that the second contact plug is in contact with an upper surface of the second impurity diffusion region.

INDUSTRIAL APPLICABILITY

The present invention is applicable to a method of manufacturing a semiconductor device.

What is claimed is:

1. A method of manufacturing a semiconductor device, the method comprising:

forming an isolation portion in a groove of a substrate;

forming a projection portion in which an upper portion of the isolation portion projects from a surface of the substrate;

forming a sidewall spacer covering a side surface of the projection portion and part of the surface of the substrate along the side surface of the projection portion; and forming a first trench in the substrate by etching the substrate using the sidewall spacer as a mask.

2. A method of manufacturing a semiconductor device, the method comprising:

forming isolation portions in grooves of a substrate;

forming at least a pair of projection portions in which upper portions of the isolation portions project from a surface of the substrate;

forming sidewall spacers covering side surfaces of the projection portions and part of the surface of the substrate along the side surfaces of the projection portions; and forming a first trench in the substrate by etching the substrate using the sidewall spacers as a mask, wherein the forming of the sidewall spacers includes forming a window to expose the surface of the substrate between the sidewall spacers of the at least the pair of projection portions facing each other.

3. The method as recited in claim 2, wherein the forming of the isolation portions includes:

forming a sacrifice film on the substrate, forming grooves opening through the sacrifice film and extending into the substrate, forming isolation portions filling in the grooves with a first insulator film having an upper surface so that the upper surface is placed between a top surface of the sacrifice film and the surface of the substrate, and removing the sacrifice film to form the projection portion in which the upper surface of the first insulator film projects from the surface of the substrate that is covered with the sacrifice film.

4. The method as recited in claim 3, wherein the forming the isolation portions includes filling the first insulator film so that an upper surface of the first insulator film has substantially the same plane with the top surface of the sacrifice film, and the forming the sacrifice film includes controlling a thickness has the same as a desired height of the projection portions.

5. The method as recited in claim 4, wherein the forming the at least the pair of projection portions includes forming the projection portions which are greater in height than a thickness of the protective film, and the forming the protective film includes controlling a thickness having the desired distance from the side surface of the projection portion.

6. The method as recited in claim 2, wherein the forming the sidewall spacers includes:

forming a protective film with a conformal step coverage on the projection portions, and anisotropic etching the protective film so as to leave the sidewall spacer along the side surfaces of the projection portions.

7. The method as recited in claim 6, wherein the forming two of the first trench in the substrate, further comprises:

forming a second trench by depositing the protective film with a conformal step coverage on the projection portions;

forming a third trench by depositing a second insulator film with a conformal step coverage on the protective film;

forming a third insulator film on the second insulator film so as to fill in the third trench;

selectively etching the third insulator film to expose the second insulator film at a region between the third trenches;

forming a belt-like pattern by selectively etching the second insulator film so as to remain under the third insulating film, using the third insulator film as a mask, in the third trenches; and removing remaining third insulator film, the forming sidewall spacers includes the anisotropic etching the protective film using the belt-like pattern as a mask, the forming the first trenches includes the etching the substrate between the sidewall spacers and the belt-like pattern.

8. The method as recited in claim 7, wherein the protective film is a material having a high etching selectivity to the second insulator film and the substrate.

9. The method as recited in claim 7, wherein the second insulator film is a material having a high etching selectivity to the third insulator film.

10. The method as recited in claim 3, wherein the forming the first trench includes forming the first trench which is smaller in depth than the groove.

11. The method as recited in claim 3, further comprising forming an etching stopper film on the substrate under the sacrifice film, the etching stopper film protecting the substrate from an etchant used to remove the sacrifice film.

12. The method as recited in claim 11, wherein the substrate is silicon, the sacrifice film includes doped silicon film, the etchant to remove the sacrifice film contains an ammonia solution.

13. The method as recited in claim 3, further comprising forming device isolation regions on the surface of the substrate before the forming of the isolation portions, the device isolation regions crossing the isolation portions and defining both ends of an active region, wherein the first insulator film is a material having a high etching selectivity to the device isolation regions and the active region.

14. The method as recited in claim 13, further comprising forming an diffusion region in the active region after the removing the sacrifice film, wherein the forming the first trench includes dividing the diffusion region into a first diffusion region and a second diffusion region.

15. The method as recited in claim 14, further comprising:

forming a gate insulator film covering an inside surface of a lower portion of the first trench; and forming a gate electrode filling the lower portion of the first trench via the gate insulator film.

16. The method as recited in claim 15, further comprising forming a buried insulator film filling an upper portion of the first trench and covering an upper surface of the gate electrode.

17. The method as recited in claim 14, further comprising:

forming a bit contact in contact with the first diffusion region;

forming a bit line connecting electrically with the bit contact;

forming an interlayer dielectric film covering the bit line; and forming a capacity contact plug extending through the interlayer dielectric film, the capacity contact plug being in contact with the second diffusion region.

18. The method as recited in claim 14, further comprising:

forming a gate insulator film covering an inside surface of a lower portion of the first trench; and forming a gate electrode filling the lower portion of the first trench via the gate insulator film, wherein the gate electrode projects from the surface of the substrate.

19. The method as recited in claim 18, further comprising:

forming an interlayer dielectric film covering part of the gate electrode that projects from the surface; and forming at least two contact plugs that each contacts with the first diffusion region and the second diffusion region and that extends through the interlayer dielectric film.

20. A method of manufacturing a semiconductor device, the method comprising:

forming isolation portions in grooves of a substrate;

forming at least a pair of projection portions in which upper portions of the isolation portions project from the surface of the substrate;

forming sidewall spacers, a belt-like pattern and windows in the same process step, the sidewall spacers covering each side surface of the projection portions and part of the surface of the substrate along the side surface of the projection portions, the belt-like pattern arranged between the sidewall spacers of at least the pair of projection portions facing each other, the window exposing the surface of the substrate between the sidewall spacer and the belt-like pattern; and forming a first trench in the substrate by etching using the sidewall spacers and the belt-like pattern as a mask.

* * * * *